United States Patent [19]

Vinal

[11] Patent Number: 5,105,105
[45] Date of Patent: * Apr. 14, 1992

[54] HIGH SPEED LOGIC AND MEMORY FAMILY USING RING SEGMENT BUFFER

[75] Inventor: Albert W. Vinal, Cary, N.C.

[73] Assignee: Thunderbird Technologies, Inc., Research Triangle Park, N.C.

[*] Notice: The portion of the term of this patent subsequent to Jul. 9, 2008 has been disclaimed.

[21] Appl. No.: 687,756

[22] Filed: Apr. 19, 1991

Related U.S. Application Data

[63] Continuation of Ser. No. 497,103, Mar. 21, 1990, Pat. No. 5,030,853.

[51] Int. Cl.$^5$ .................... H03K 19/94; H03K 19/17; H03K 23/54; H03K 23/52
[52] U.S. Cl. .................... 307/451; 307/450; 307/446; 307/443; 377/122
[58] Field of Search ............... 307/443, 446, 448, 450, 307/451, 475, 570, 571, 576, 579, 585, 542, 544, 280, 300; 377/122-124

[56] References Cited

U.S. PATENT DOCUMENTS

| | | | |
|---|---|---|---|
| 4,185,209 | 1/1980 | Street | 307/446 |
| 4,209,713 | 6/1980 | Satou et al. | 307/446 X |
| 4,394,769 | 7/1983 | Lull | 377/116 |
| 4,541,076 | 9/1985 | Bowers et al. | 365/230.08 |
| 4,680,491 | 7/1987 | Yokouchi et al. | 365/189.05 X |
| 4,713,796 | 12/1987 | Ogiue et al. | 365/230.08 |
| 4,719,369 | 1/1988 | Asano et al. | 307/446 |
| 4,727,266 | 2/1988 | Fujii et al. | 307/443 |
| 4,740,718 | 4/1988 | Matsui | 307/446 |
| 4,802,127 | 1/1989 | Akaogi et al. | 365/189.05 |
| 4,802,132 | 1/1989 | Ohsawa | 365/189.05 |
| 4,808,850 | 2/1989 | Masuda et al. | 307/446 |
| 4,825,420 | 4/1989 | Min | 365/230.08 |
| 4,871,928 | 10/1989 | Bushey | 307/446 |
| 4,890,018 | 12/1989 | Fukushi et al. | 307/446 |
| 5,030,853 | 7/1991 | Vinal | 307/451 |

FOREIGN PATENT DOCUMENTS

| | | | |
|---|---|---|---|
| 55-45207 | 3/1980 | Japan | 307/446 |
| 60-141018 | 7/1985 | Japan | 307/446 |

OTHER PUBLICATIONS

"Complimentary BI-FET Logic Circuitry", IBM Technical Disclosure Bulletin, vol. 15, No. 8, pp. 2571-2-2572, Jan. 1973.
"High Speed CMOS NOR Circuit" 24534, Research Disclosure, No. 245, Sep. 1984.

Primary Examiner—Edward P. Westin
Assistant Examiner—David R. Bertelson
Attorney, Agent, or Firm—Bell, Seltzer, Park & Gibson

[57] ABSTRACT

A logic and memory family using CMOS technology operates at high speeds using a Ring Segment Buffer to couple logic gates to one another in an integrated circuit chip, and to couple memory cells to other circuits to provide shift registers, triggers, clock pulse generators and other memory related circuits. The Ring Segment Buffer comprises one or more serially connected complementary field effect transistor (FET) inverter stages, with the output of a preceding stage being connected to the input of a succeeding stage. The N-channel FET in each inverter stage has a channel width which is less than a predetermined factor (K) times the width of the N-channel of the immediately preceding stage. By maintaining the K channel width relationship, the Ring Segment Buffer can drive large capacitive loads at high speed. The Ring Segment Buffer may also provide a predetermined delay which is a function of channel length and the number of stages. For large capacitive loads, the last stage of the Ring Segment Buffer may be replaced by a bipolar transistor-FET driver in which minority carrier lifetime controlled bipolar transistors are used.

The Buffer Cell Logic and Delay Storage technology of the present invention may operate at speeds of 300 megahertz or more using conventional semiconductor fabrication processes in which conventional CMOS logic and memory technology operates at 70 megahertz or less. A fourfold speed improvement is thereby obtained.

9 Claims, 11 Drawing Sheets

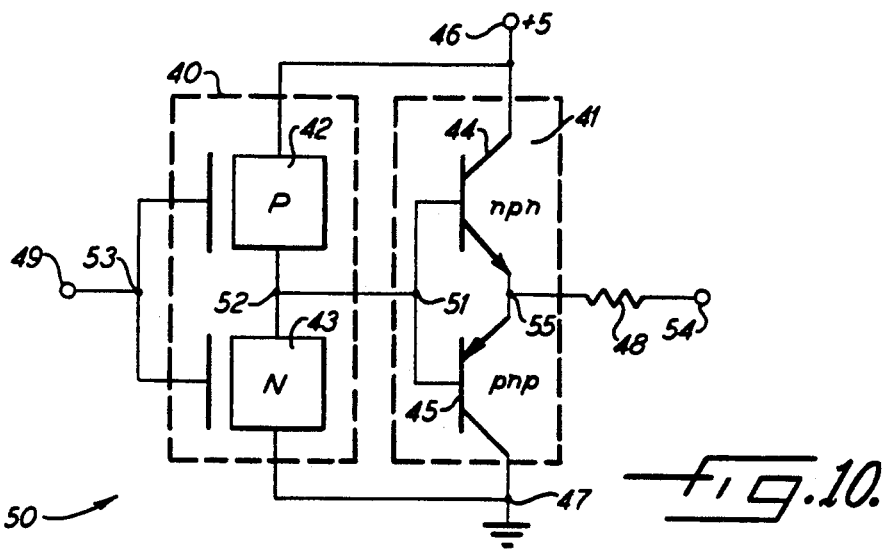
_Fig. 10._
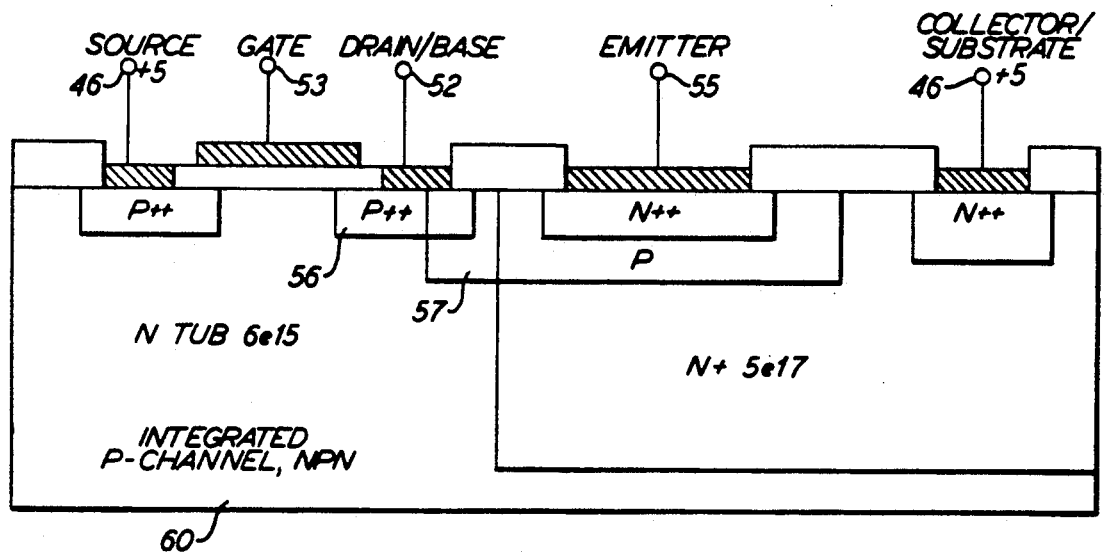
_Fig. 11A._
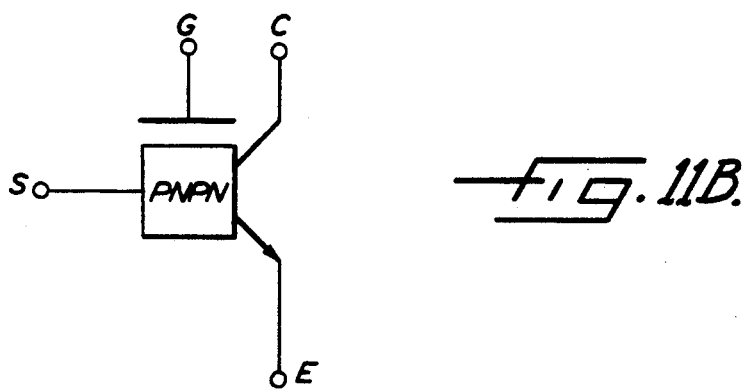
_Fig. 11B._

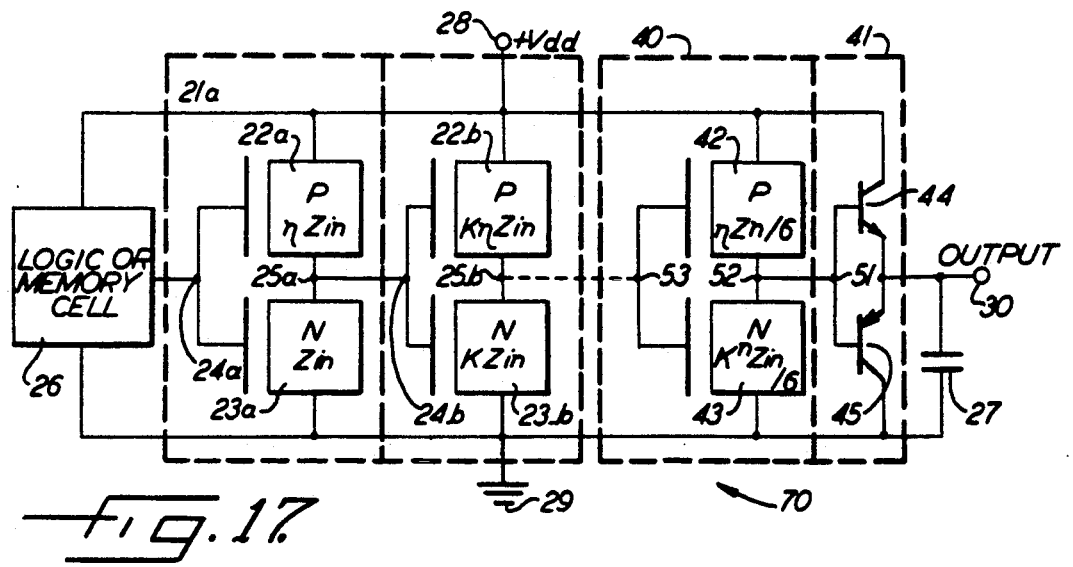
_fig. 17._
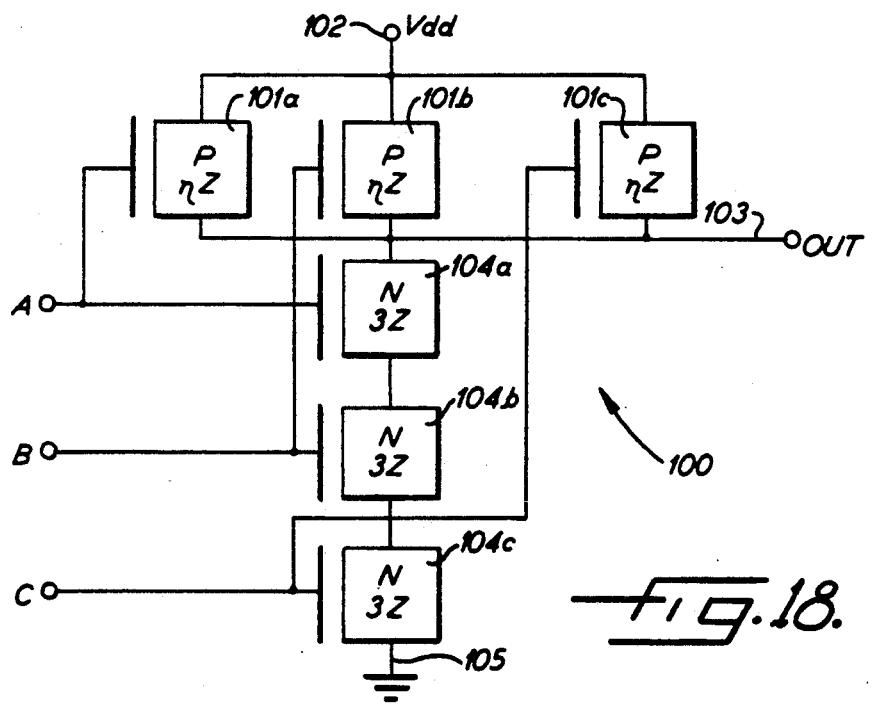
_fig. 18._
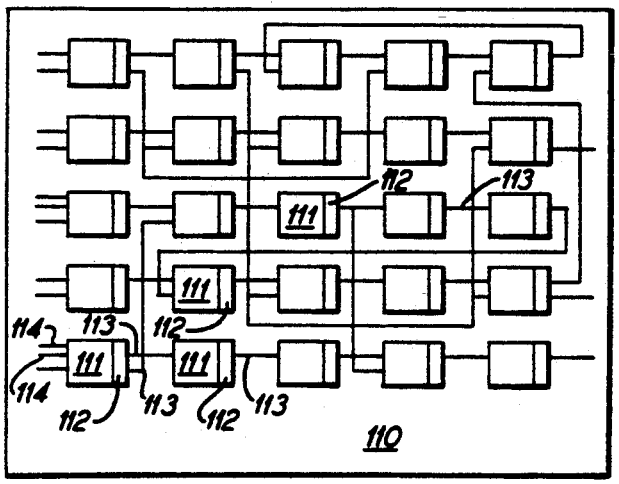
_fig. 19._

HIGH SPEED LOGIC AND MEMORY FAMILY USING RING SEGMENT BUFFER

This application is a continuation of application Ser. No. 07/497,103, filed Mar. 21, 1990 now U.S. Pat. No. 5,030,853.

FIELD OF THE INVENTION

This invention relates to logic and memory circuits and more particularly to logic and memory circuits which are designed to be integrated into high density integrated circuit chips and to operate at high speed.

BACKGROUND OF THE INVENTION

There is a continuing need to increase the operating speed of digital systems. As is well known to those having skill in the art, a primary speed limiting factor is the integrated circuit logic and memory technology used in such systems. Several different technologies continue to be investigated in order to increase circuit speed. The basic technologies use bipolar transistors or field effect transistors (FET) or a combination thereof to form logic and memory circuits. In bipolar transistor technology, logic families such as emitter coupled logic (ECL) and transistor-transistor logic (TTL) have been designed. However, the basic drawback of bipolar transistor technology is the high power consumed by the circuits and the speed limitation of these circuits.

The art has also explored the use of FET based technologies. Most popular is the complementary metal oxide semiconductor (CMOS) technology in which complementary N-channel and P-channel FETs are used for logic and memory families. CMOS technology has great appeal because of the lack of DC power dissipation. In other words, logic and memory circuits only dissipate power when they are switching from one logic state to another but not when they are idling at a given logic state. CMOS circuits are also easy to manufacture using well developed silicon based technology. The basic drawback of CMOS, however, is its operating speed. Accordingly, the art has thoroughly investigated techniques for increasing the speed of CMOS circuits while still providing the basic advantages of CMOS. See for example U.S. Pat. No. 4,541,076 to Bowers et al. which discloses a technique for efficiently integrating a CMOS memory and CMOS logic gate array on a single substrate. See also the anonymous publication in Research Disclosure, September 1984, Number 245 entitled "High Speed CMOS NOR Circuit" which discloses a two-stage CMOS circuit for high speed logical operations.

Buffers have been used in logic and memory circuits in an attempt to enhance the operation thereof. See for example U.S. Pat. No. 4,802,132 to Ohsawa which discloses the use of buffers in a memory cell. U.S. Pat. No. 4,680,491 to Yokouchi et al. discloses a CMOS circuit having an output buffer for bidirectional input/output signals. U.S. Pat. No. 4,802,127 to Akaogi et al. discloses the use of plural inverters as an output buffer to reduce transient current multiplication by those output stages which would otherwise cause a significant rise in the potential level of the power source line in a semiconductor memory device.

The art has also investigated the use of inverters in logic and memory circuits to accomplish various purposes. See for example U.S. Pat. No. 4,209,713 to Satou et al. which discloses a CMOS inverter circuit. See also U.S. Pat. No. 4,825,420 to Min which discloses the use of buffer inverters to provide the correct signal polarity to control Schmitt triggers and memory addressing. See also U.S. Pat. No. 4,185,209 to Street which discloses the use of inverters to convert negative logic (NAND/NOR) CMOS technology into positive logic (AND/OR) technology.

The art has also investigated the use of bipolar and field effect transistors together in order to obtain the advantages of both. See for example U.S. Pat. No. 4,713,796 to Ogiue et al. which integrates bipolar and CMOS circuits for high speed operation. See also U.S. Pat. No. 4,740,718 to Matsui which integrates bipolar and CMOS circuits so that the CMOS logic controls the base current of a pull-up NPN bipolar transistor. See also U.S. Pat. No. 4,808,850 to Masuda et al. which discloses inverters having unidirectional elements therein and Japanese published applications 55-45207 to Horie (published Mar. 29, 1980) and 60-141018 to Ozawa (published July 26, 1985) which disclose integrated bipolar and CMOS circuits which use diodes to connect the FETs and the bipolar transistors in order to suppress spike noise and provide high speed operation. A bipolar and CMOS logic gate which can function as either a CMOS or a bipolar logic circuit using the same devices and connections is shown in IBM Technical Disclosure Bulletin, Vol. 15, No. 8, January 1973, pp. 2571-2572 to Blose et al.

Notwithstanding the above described and other improvements, present state of the art CMOS circuits are limited to speeds of about 70 mHz. In an effort to provide higher speed logic and memory circuits, the art has also investigated exotic materials other than silicon, such as compound semiconductors like gallium arsenide and indium phosphide. However, these exotic materials often require discarding or reworking the large investment in silicon based processing equipment and techniques; require processing tolerances which are increasingly difficult to attain and also introduce their own set of problems for high speed operation.

SUMMARY OF THE INVENTION

It is therefore an object of the invention to provide high speed logic and memory circuits.

It is another object of the invention to provide high speed logic and memory circuits which may be formed at high densities on integrated circuit chips.

It is yet another object of the invention to provide high density logic and memory circuits with minimal DC power dissipation.

It is still another object of the invention to provide high speed, high density and low power logic and memory circuits which are easily formed using conventional silicon based materials and processes.

These and other objects are provided by a high speed logic and memory family which uses a Ring Segment Buffer. The Ring Segment Buffer is used to couple logic gates to one another on an integrated circuit chip and to couple a memory cell to other circuits to provide shift registers, triggers, clock pulse generators, and other circuits which are necessary to implement a microprocessor. For ease of explanation, the Ring Segment Buffer of the present invention will first be described. Then, the logic circuit family and memory circuit family of the present invention using the Ring Segment Buffer will be described.

According to the invention, the Ring Segment Buffer comprises one or more serially connected, complementary field effect transistor (FET) inverter stages. Each of the complementary FET inverter stages includes a serially connected N-channel FET and P-channel FET. Each stage has an input and an output, with the output of an immediately preceding stage is connected to the input of an immediately succeeding stage. The output of the last inverter stage is connected to a capacitive load which is to be driven by the Ring Segment Buffer. As is well known to those having skill in the art, the capacitive load may include other logic gates, other memory circuits, interconnection wiring (both on and off chip) and combinations of these and other loads.

According to the invention, the N-channel FET and P-channel FET in each inverter stage have channel widths which are less than a predetermined factor times the width of the corresponding N-channel FET and P-channel FET, respectively, of the immediately preceding inverter stage. In each inverter stage, the channel of the P-channel FET is wider than the channel of the corresponding N-channel FET, by $\eta$, the ratio of electron mobility in the N-channel to hole mobility in the P-channel. By maintaining the relationship between FET channel widths of succeeding stages less than the factor, the Ring Segment Buffer can drive the capacitive load at very high speeds, such as 300 mHz or more. In particular, the factor, referred to as "K" is defined by:

$$K = \frac{I^*_{sat}T_{rise}}{2(1 + \eta)C_g^* L_o^2 V_{dd}\left(1 + \frac{L_c}{a_o L_o}\right)}$$

where $I^*_{sat}$ is the channel saturation current of a square channel FET having width and length of $L_o$ and gate voltage at $V_{dd}$; $T_{rise}$ is the desired rise time of the Ring Segment Buffer; $\eta$ is the ratio of electron mobility in the N-channel to electron mobility in the P-channel; $C^*_g$ is the effective gate capacity per unit area of the capacitive load; $L_o$ is the channel length for the complementary field effect transistors in the Ring Segment Buffer stages; $V_{dd}$ is the power supply voltage applied to the Ring Segment Buffer; $L_c$ is the interconnecting conductor length between inverter stages; and $a_o$ is equal to $C_g^*(1+\eta)/C_1\beta$, where $C_1$ is equal to field oxide insulator capacity per unit area; and $\beta$ is equal to the ratio of the width of the interconnecting conductor at the output of the inverter and the width of the first N-channel in the Ring Segment Buffer.

It has been found, according to the invention, that the Ring Segment Buffer may be used to couple a logic or memory circuit to an arbitrary size capacitive load without degrading the inherent response time of the logic or memory circuit. The channel widths in the last Ring Segment Buffer stage are determined by the size of the load to be driven. The channel widths of the first stage are determined by the N-channel width of the logic or memory cell. In particular, the N-channel width of the first stage must be less than K times the N-channel width of the logic or memory cell, with the P-channel width being $\eta$ times the N-channel width. The number of stages in the Ring Segment Buffer is determined by the number of stages required to allow the transistors of each stage to have a width which is less than K times the channel width of the previous stage. Accordingly, the larger the capacitive load, the more stages in the Ring Segment Buffer which will be necessary, each stage observing the relationship for K.

It has also been found, according to the invention, that the Ring Segment Buffer may be used to provide a predetermined delay, in addition to driving an arbitrarily large capacitive load. In particular, it has been found that the Ring Segment Buffer may provide the desired delay by varying the channel lengths of the P-channel and N-channel devices in the Ring Segment Buffer to define a desired rise time which controls delay. In particular, while still observing the K factor relationship defined above for driving the capacitive load, a desired delay may be obtained by using the following equation:

$$T_d = 0.65 n T_{rise}$$

where n is the number of stages in the Ring Segment Buffer and $T_{rise}$ in the rise time selected for the inverters comprising the Ring Segment Buffer. The length $L_o$ of the P-channel and N-channel FETs in the Ring Segment Buffer may be chosen to satisfy a desired rise time as according to the following equation:

$$L_o = \left[\frac{I^*_{sat}T_{rise}}{2(1 + \eta)C_g^* K V_{dd}\left(1 + \frac{L_c}{a_o L_o}\right)}\right]^{\frac{1}{2}}$$

Accordingly, by properly choosing the physical parameters of the FETs comprising the Ring Segment Buffer, a predetermined delay and speed may be obtained.

When driving large capacitive loads it has been found that the FETs in the last stage of the Ring Segment Buffer become very wise. To reduce this width, according to the present invention, the last stage FETs may be replaced with an integrated bipolar-FET circuit. Although bipolar and FET circuits have been integrated before, it has been found, according to the present invention, that large capacitive loads may be driven by the bipolar/integrated circuit without affecting response speed by providing a "Lifetime Controlled" bipolar transistor in an integrated bipolar-FET circuit. In other words, the minority carrier lifetime within the silicon base region of the bipolar transistors must be lowered from typical values of 5e−7 seconds to 8e−9 seconds or less. Reduction in lifetime must be achieved while maintaining a current gain $\beta$ of 20 or greater. It has been found according to the invention that the critical step of lowering carrier lifetime may be accomplished by doping the base region of the bipolar transistors with gold. The gold doping introduces paired donor and acceptor recombination centers within the base region with energy states within the middle of the bandgap.

According to the invention, the Lifetime Controlled integrated bipolar and FET device may be used as a last stage of a Ring Segment Buffer. Alternatively, it may be used by itself as a single stage Ring Segment Buffer for driving large capacitive loads in logic and memory applications. Use of the Lifetime Controlled integrated bipolar and FET circuit has been found to reduce the necessary channel width of the FET devices in the last stage by about a factor of six. Very wide channel devices therefore need not be used.

The use of the Ring Segment Buffer in logic applications will now be described. In general, the present invention provides a Ring Segment Buffer at the output of each logic gate in an integrated circuit logic chip, to couple each logic gate to its capacitive load and provide "Buffer Cell Logic". The load may be other logic gates and gate interconnections, either on chip or off chip. The Ring Segment Buffer is designed as described above. Accordingly, a Buffer Cell Logic chip according to the present invention will include a Ring Segment Buffer between the output of each logic gate and its associated load, with each Ring Segment Buffer having the number of stages n which allows factor K to be observed, to thereby drive the effective capacitive load at the desired logic chip speed. The number of stages in the Ring Segment Buffer for each logic gate will vary depending upon the load for that gate. However, each Ring Segment Buffer will observe the relationship described above and will be designed for operation at the desired logic speed.

It has also been found, according to the invention, that the inherent speed of a logic gate may be maximized by redesigning the CMOS logic gate itself. In particular, as is well known to those having skill in the part, a CMOS logic gate typically includes serially connected FETs of a first conductivity type and parallel connected FETs of opposite conductivity type, with the number m of serially connected FETs and parallel connected FETs being equal to the number of logical inputs to the gate. Each gate logical input is connected to one of the serial FETs and one of the parallel FETs. A CMOS logic gate degenerates to a complementary inverter when m equals 1. An inverter has a symmetric voltage transfer function when the P-channel transistor has a channel width $\eta$ times the width of the N-channel transistor, where $\eta$ is the ratio of electron to hole mobility. These channel widths are defined as the "inverter equivalent widths".

According to the invention, the channel width of each of the serially connected FETs is made larger than the equivalent inverter channel width by the number of FETs connected in series or in parallel. In other words, the channel widths of the serially connected FETs are m times wider than the appropriate P-channel or N-channel width of an equivalent inverter. This produces a symmetrical transfer function for the logic gate, and allows high speed operation of the gate itself. According to the invention, the CMOS logic gate may be coupled to other gates using a Ring Segment Buffer.

Computer simulations have shown that CMOS logic circuits according to the invention will operate at speeds of 300 mHz using standard device processing dimensions and parameters, in which ordinary CMOS logic will operate at 70 mHz or less. Accordingly, a factor of 4 or more in speed may be attained without introducing exotic materials or dissipating DC power.

In order to design a high speed microprocessor, high speed memory circuits are also required. A limiting factor in present day memory circuits is that they require two clock pulses for operation. Consider for example, a standard shift register circuit in which a number of memory stages are serially connected so that the contents of a previous stage can be shifted to a succeeding stage. Normally, two clock pulses are required; i.e. a first clock pulse to shift the data to a temporary stage and the second clock pulse for then shifting the data from the temporary stage into the next shift register. If a single clock pulse is used, the new data which is shifted into a shift register stage overwrites the old data before it can be shifted into the next stage.

According to the present invention, a Ring Segment Buffer may be coupled to the output of a memory cell to provide a predetermined delay and to drive the next stage at high speed regardless of its load capacitance, in a "Delay Storage" technology. Since the Ring Segment Buffer provides a predetermined delay, a single clock pulse may be used, with the memory cell providing its own internal time delay. Accordingly, shift registers, triggers, clock pulse generators and other memory-based circuits necessary to form a high speed microprocessor may be provided using Delay Storage technology.

In particular, a basic memory element may be provided according to the invention by coupling the output of a CMOS memory cell (comprising a well known pair of cross-coupled complementary FET inverters), to a Ring Segment Buffer. The Ring Segment Buffer is designed (1) to provide a desired delay, by controlling the channel length of the transistors therein, and (2) to drive the necessary capacitive load by controlling channel width to observe the factor K. Accordingly, the output of the Ring Segment Buffer provides the new shift register contents after a predetermined delay. The output of the Ring Segment Buffer may be coupled to a next memory cell to provide a shift register which uses only a single clock pulse. A clock generator or multivibrator circuit may also be provided using a Ring Segment Buffer at the output of a cross coupled memory cell by feeding the output of the Ring Segment Buffer back to the input of the memory cell. The delay in the Ring Segment Buffer will determine the ultimate clock (vibrator) frequency. Synchronous or asynchronous clock pulses may be provided.

As described above, the Ring Segment Buffer of the present invention may be coupled to CMOS memory cells to provide the memory circuits needed for high speed microprocessor operation, using a single clock pulse. At least a fourfold increase in operating speed may be attained without loss of functional density on the chip while using standard silicon FET fabrication processes. Performance at 300 mHz or more may be provided using silicon technology.

BRIEF DESCRIPTION OF THE DRAWINGS

FIG. 10 illustrates a BICMOS buffer according to the present invention.

FIGS. 11a and 11b illustrate a cross section of an integrated circuit p-channel BIFET driver according to the present invention.

FIG. 17 illustrates a Ring Segment Buffer having a BICMOS buffer as its last stage, according to the present invention.

FIG. 18 illustrates a CMOS logic gate having symmetrical transfer function according to the present invention.

FIG. 19 illustrates a Buffer Cell Logic chip according to the present invention.

DESCRIPTION OF THE PREFERRED EMBODIMENT

Figure 1:
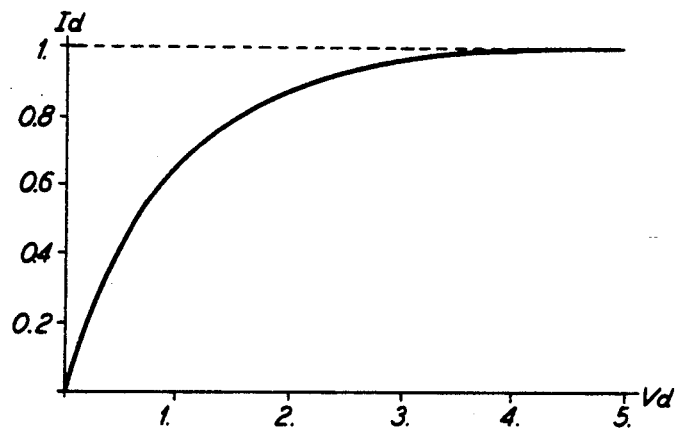
FIG. 1 graphically illustrates N-channel normalized drain current in an inverter as a function of drain voltage for a step function input.

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout.

According to the present invention a Ring Segment Buffer may be used in combination with logic gates and memory cells to provide a high speed logic and memory family. The design of the Ring Segment Buffer according to the present invention will first be described. Then, the use of the Ring Segment Buffer to produce a Buffer Cell Logic family will be described. Finally, the use of a Ring Segment Buffer to produce memory circuits will be described.

RING SEGMENT BUFFER

The Ring Segment Buffer of the present invention may be used for driving a broad range of capacitive loads at high speeds. According to the invention, the Ring Segment Buffer comprises one or more serially connected complementary field effect transistor (FET) inverter stages, each of which comprises a serially connected N-channel and P-channel FET. Each inverter has an input and an output, with the output of an immediately preceding inverter being connected to the output of an immediately succeeding inverter, and the output of the last inverter being connected to the capacitive load. According to the invention, the Ring Segment Buffer may be designed to drive an arbitrarily sized capacitive load with a specific signal rise time, by making the channel width of each N-channel and P-channel field effect transistor in the Ring Segment Buffer less than a factor K times the width of the corresponding N-channel or P-channel transistor of the immediately preceding inverter stage. In other words, for a given capacitive load, and desired signal rise time, a factor K is determined which governs the maximum increase in channel width of the devices in succeeding stages of the Ring Segment Buffer. In any given stage, the channel of the P-channel FET is wider than the channel of the corresponding N-channel FET, by $\eta$, the ratio of electron mobility in the N-channel to hole mobility in the P-channel. A Ring Segment Buffer, having the requisite number of stages to drive the capacitive load, with the relationship between stages defined by the factor K, may thereby be provided. This Ring Segment Buffer may be used in integrated circuit logic and memory circuits as described below.

Analysis begins by finding an expression that defines the drain voltage as a function of time when charging or discharging a capacitive load by the channel current flowing in a complementary FET inverter. As is well known to those having skill in the art, a complementary FET inverter comprises an N-channel FET and a P-channel FET, the sources and drains of which are serially connected between two voltage potentials, typically a power supply voltage and ground, with the gates of the serially connected FETs being connected together to provide an inverter input, and the common connection point between the serially connected FETs being the output of the inverter. First it will be assumed that the gate voltage reaches the maximum value in accordance with a step function. Then the effects of input rise time are accounted for. The maximum drain current-voltage profile as a function of drain voltage is defined and then solved to obtain the time dependence of drain voltage during capacitor charge or discharge.

Inverter Output Response—Step Function Input

The following expression defines drain current assuming that maximum gate voltage has been rapidly applied. A step function is assumed. The effects of source voltage are ignored in this analysis:

$$I_d = I_{dsat}\left[1 - \left(\frac{1}{M}\right)^{\frac{V_d}{V_p}}\right] \quad (1)$$

Where;

M is typically 200 and depends on saturation velocity, ionization field, and carrier mobility.

$V_d$ is drain voltage $V_p$ is pinch-off voltage $I_d$ is the drain current $I_{dsat}$ = Maximum channel current at $V_d = V_{dd}$.

FIG. 1 illustrates N-channel normalized drain current as a function of drain voltage given 5 volts on the gate. Drain current in FIG. 1 has been normalized to $I_{dsat}$. Assume that load capacity at the drain of the inverter is discharged by the N-channel drain current. Discharge current starts as $I_{dsat}$, for $V_d=V_{dd}$, and eventually decreases to zero as drain and capacitor voltage drops. In order to find an expression that relates real time t, to drain voltage, $V_d$, drain current is equated with capacitor current:

$$C\frac{dV_d}{dt} = I_{sat}\left[1 - \left(\frac{1}{M}\right)^{\frac{V_d}{V_{dd}-V_t}}\right] \quad (2)$$

Separating variables and integrating one obtains:

$$t = \frac{C}{I_{sat}} \int_{V_{dd}}^{V_d} \frac{dV_d}{1 - \left(\frac{1}{M}\right)^{\frac{V_d}{V_{dd}-V_t}}} \quad (3)$$

Solving equation (3) one obtains:

$$t = \frac{CV_{dd}}{I_{sat}} F\left(\frac{V_d}{V_{dd}-V_t}\right) = \tau_o F\left(\frac{V_d}{V_{dd}-V_t}\right) \quad (4)$$

Where;

$$F\left(\frac{V_d}{V_{dd}-V_t}\right) = \ln\left[\frac{\left(\frac{1}{M}\right)^{\frac{V_d}{V_{dd}-V_t}}\left(1-\frac{1}{M}\right)}{\frac{1}{M}\left(1-\left(\frac{1}{M}\right)^{\frac{V_d}{V_{dd}-V_t}}\right)}\right]\frac{1}{\ln(M)} \quad (5)$$

$$\tau_o = \frac{CV_{dd}}{I_{sat}}$$

$V_t$ = Threshold voltage

Figure 2:
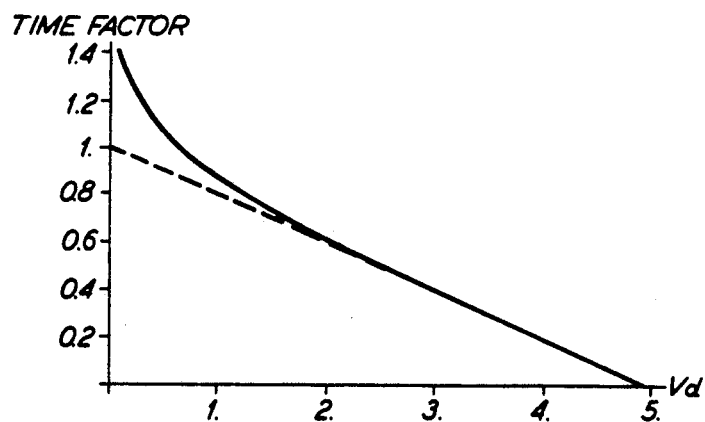
FIG. 2 graphically illustrates the capacitive discharge time factor as a function of drain voltage for an inverter.

FIG. 2 is a plot of the discharge time factor F as a function of drain voltage dropping from $V_{dd}$ to 50 millivolts given M=200.

It may be seen from FIG. 2 that voltage and time are linearly related throughout a great portion of the discharge or charge cycle. Non-linearity occurs at low drain voltage when drain current decreases rapidly with drain voltage (see FIG. 1).

Equations (4) and (5) are used to find an expression for drain voltage as a function of time, $V_d(t)$. This analysis requires use of log identities. The result is given below as Equation (6) for the discharge case. Equation (7) gives the expression for charging the load capacitance:

$$\frac{V_d(t)}{V_{dd}} = \frac{1}{\ln(M)} \ln\left[\frac{M^{\frac{t}{\tau_o}} + M\left(1 - \frac{1}{M}\right)}{M^{\frac{t}{\tau_o}}}\right] \quad (6)$$

-continued $$\frac{V_d(t)}{V_{dd}} = 1 - \frac{1}{\ln(M)} \ln\left[\frac{M^{\frac{t}{\tau_o}} + M\left(1 - \frac{1}{M}\right)}{M^{\frac{t}{\tau_o}}}\right] \quad (7)$$

Accordingly, drain discharge current as a function of time is:

$$I_D(t) = I_{sat}\left[1 - \left(\frac{1}{M}\right)^{\frac{1}{\ln(M)}\ln\left[\frac{M^{\frac{t}{\tau_o}}+M(1-\frac{1}{M})}{M^{\frac{t}{\tau_o}}}\right]}\right] \quad (8)$$

Figure 3:
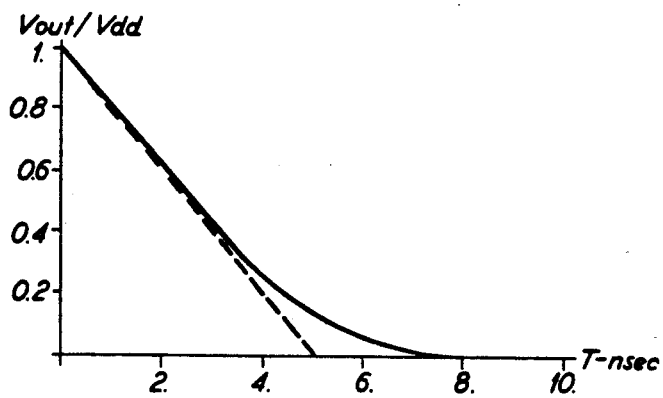
FIG. 3 graphically illustrates normalized output voltage of an inverter as a function of time.
Figure 4:
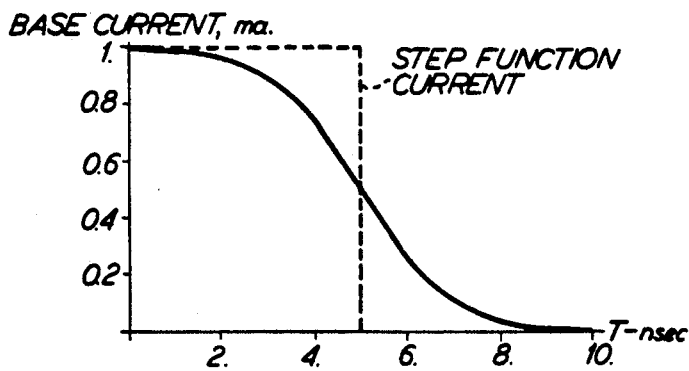
FIG. 4 graphically illustrates drain current of an inverter as a function of time during capacitive discharge.

Normalized output voltage, Equation (6), is plotted in FIG. 3 given a load capacitance C1 of 1 pF and a channel saturation current of 1 ma. The time dependent drain current, Equation (8), is plotted in FIG. 4. Note that 50% of the saturation drain current flows at the discharge or charge time produced by an ideal step function drain current.

Referring now to FIG. 3, the fall-time from $V_d=V_{dd}$ to $V_d=50$ mV takes 6.2 ns for the example given. To achieve a fall-time of 1 ns, a symmetrically designed buffering inverter must be designed by increasing the P-channel and N-channel widths that will deliver a saturation current of 6.2 ma when $V_d$ is close to the supply voltage $V_{dd}$. Typically 6.2 ma current requires an N-channel FET device with channel width of about 20 μm and the width of a P-channel device of about 50 μm. For these currents and channel widths, channel length is assumed to be 1 μm. For load capacitance greater than 1 pF, channel dimensions are proportionately increased to achieve the same rise time. These large channel dimensions are required to drive large load capacitance, and consume chip real estate that might otherwise be used for logic functions.

Inverter Output Response—Input Having Finite Rise Time

The above analysis derived the output response time for an inverter assuming that the gate input function was a step function. The following analysis derives expressions that define inverter output response time when the gate input signal has a finite rise time constant $\tau_r$. Under these circumstances, Equation (2) becomes:

$$C\frac{dV_d}{dt} = I_{sato}\left(1 - e^{-\left(\frac{2t}{\tau_r}\right)^2}\right)\left[1 - \left(\frac{1}{M}\right)^{\frac{V_d}{V_{dd}}}\right] \quad (9)$$

The above expression utilizes the following equation to describe the input signal:

$$\text{Rise Function} = \left(1 - e^{-\left(\frac{2t}{\tau_r}\right)^2}\right) \quad (10)$$

Figure 5:
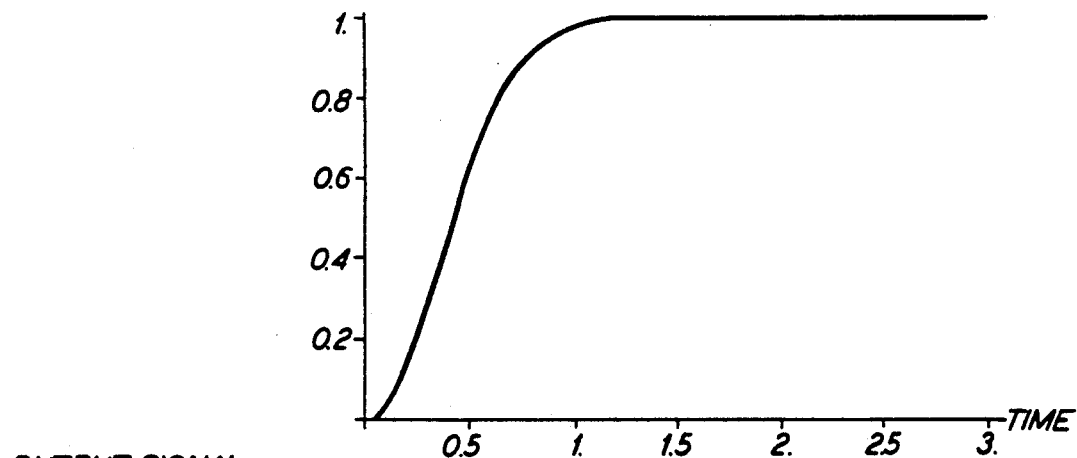
FIG. 5 graphically illustrates an input signal having a finite rise time.

A plot of the input signal function is shown in FIG. 5. It is evident from FIG. 5 that the input rise time is equal in value to time constant $\tau_r$. Separating varaibles in Equation (9) and integrating, the following expression is obtained:

$$\int_{V_{dd}}^{V_d} \frac{dV_d}{1 - \left(\frac{1}{M}\right)^{\frac{V_d}{V_{dd}}}} = \frac{I_{sato}}{C} \int_0^t \left(1 - e^{-\left(\frac{2t}{\tau_r}\right)^2}\right) dt \quad (11)$$

The solution to Equation (11) is:

$$\frac{CV_{dd}}{I_{sato}} F\left(\frac{V_d}{V_{dd} - V_t}\right) = t - \frac{\sqrt{\pi}\, \tau_r Erf\left(\frac{2t}{\tau_r}\right)}{4} \quad (12)$$

where $F(V_d/V_{dd}-V_t)$ is given by Equation (5). Solving Equation (12) for $V_d(t')$ one obtains:

$$V_d(t') = \frac{V_{dd}}{\ln(M)} \ln\left[\frac{M^{\frac{t'}{\tau_0}} + M - 1}{M^{\frac{t'}{\tau_0}}}\right] \quad (13A)$$

for the "discharge" case, and $$V_d(t') = V_{dd}\left[1 - \frac{1}{\ln(M)} \ln\left[\frac{M^{\frac{t'}{\tau_0}} + M - 1}{M^{\frac{t'}{\tau_0}}}\right]\right] \quad (13B)$$

for the charge case.
In both expressions t' is defined as:

$$t' = t - \frac{\sqrt{\pi}\, \tau_r Erf\left(\frac{2t}{\tau_r}\right)}{4} \quad (14A)$$

$$\tau_0 = \frac{CV_{dd}}{I_{sato}} \quad (14B)$$

Figure 6A:
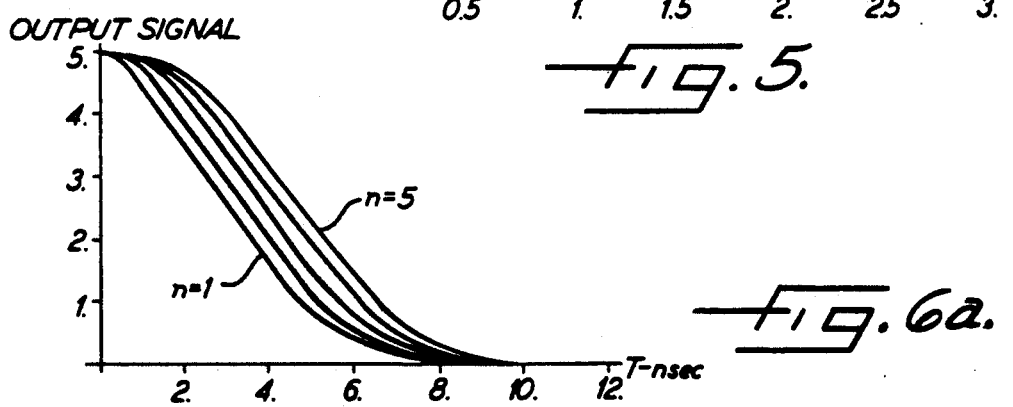
FIGS. 6a and 6b graphically illustrate an inverter output as a function of time during discharge.
Figure 6B:
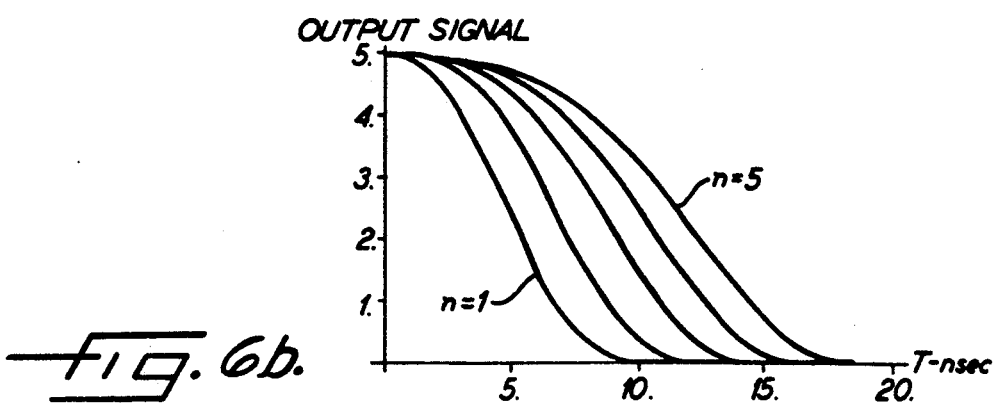

FIG. 6a and FIG. 6b show computer generated solutions for Equation (13A) for buffer output response time for a range of input rise times $\tau_r = n\tau_0/k$. In FIG. 6a k=5, and k=1 in FIG. 6b.

When k=5, the input signal rise time ranges from $\tau_r = 0.2\tau_0$ to $\tau_r\tau_0$. When k=1, input rise time is in the range $\tau_r\tau_0$ to $\tau_r = 5\tau_0$. Both FIGS. 6a and 6b show that there are two major effects produced at the inverter output resulting from a gate input signal with finite rise time. For $\tau_r < \tau_0$, the major effect is to introduce delay to the output signal while maintaining essentially the same slope. When $\tau_r > \tau_0$, both delay and slope times are increased with increasing input signal rise times. In both figures, load capacity is 1 pF, drain voltage is 5 V and $I_{sato}$ is 1 ma.

The output signal response due to a step function input signal is shown in FIG. 3. The response time of an inverter is shown in FIG. 6a, where, by design $\tau_r = \tau_0$. Based on these observations for $\tau_r = \tau_0$, a simple conservative design equation can be used to describe inverter or Ring Segment Buffer output response time that includes delay effects. That equation is:

$$T_{rise} = \frac{2CV_{dd}}{I} \quad (15)$$

This equation is used in the design theory for 300 mHz digital systems according to the present invention.

Inverter Design For Desired Rise Time

The following analysis defines the minimum width dimension $Z_{in}$ of the N-channel FET for an inverter to drive its load capacitance at the desired rise time. The rise time, Equation (15), derived above is used:

$$Q = CV = \frac{I}{2} T_{rise} \quad (16)$$

Solving for I one obtains:

$$I = \frac{2CV}{T_{rise}} \quad (17)$$

Where;
C = load capacitance, (Farads)
V = total charge voltage (Volts)
$T_{rise}$ = rise time (Seconds)
$I^*_{sat}Z_{in}/L_o$ (Amps)
$Z_{in}$ = channel width of the N-channel device in the inverter.
$I^*_{sat}$ = saturation current in a square channel (width = length = $L_o$)
Substitution gives:

$$Z_{in} = \frac{2CVL_o}{I^*_{sat}T_{rise}} \quad (18)$$

Equation (18) is a basic equation. To simplify design procedures, it is convenient to express load capacity C in terms of gate capacitance:

$$C = C^*_g Z_L L_o \quad (19)$$

Where
$L_o$ is the minimum channel length in cm.
$Z_L$ is the total effective load channel width
$C^*_g$ is gate capacity per square cm.
Substitution gives:

$$Z_{in} = \frac{2C^*_g L_o^2 V_{dd}}{I^*_{sat}T_{rise}} Z_L \quad (20)$$

$Z_{in}$ and $Z_L$ can have any dimension. It is appropriate to define $Z_{in}$ and $Z_L$ in microns. $Z_L$ is the total sum of all effective gate widths being driven. The permissible reduction factor $R_R$ for the FET inverter stage channel width $Z_{in}$ is given by (21) below; i.e., $Z_{in} = F_R Z_L$.

$$F_R = \frac{2C^*_g L_o^2 V_{dd}}{I^*_{sat}T_{rise}} \quad (21)$$

This factor should be as small as possible for any given output rise time objective. It should be noted that Equation (21) depends directly on the square of the minimum channel length $L_o$, directly with gate capacitance per square centimeter, $C^*_g$, and inversely with square channel saturation current $I^*_{sat}$.

The Fermi FET technology described in copending application Ser. No. 07/318,153 filed Mar. 2, 1989 entitled *Fermi Threshold Field Effect Transistor*, allows gate capacitance to be reduced compared to the MOSFET, so that shorter channels can be achieved while increasing the square channel saturation current. Fermi FET technology can lower the channel reduction factor $F_R$ at least one order of magnitude compared to MOSFET devices.

Equation (21) will now be evaluated for conventional MOSFET devices and for Fermi FET devices. For typical conventional MOSFET devices:

$C^*_g = 1.5e-7$ Farads/cm$^2$,
$L_o = 1.2e-4$ cm,
$V_{dd} = 5$ Volts,
$I^*_{sat} = 2e-4$ Amps,
$T_{rise} = 1$ ins,
so that $F_R = 0.108$.

For Fermi FET devices:

$C^*_g = 6e-8$ Farads/cm$^2$,
$L_o = 0.5e-4$ cm,
$V_{dd} = 5$ Volts,
$I^*_{sat} = 4e-4$ Amps,
$T_{rise} = 1$ ns,
so that $F_R = 0.0035$ This low value of $F_R$ for Fermi FET technology, significantly increases the permissible density of components per unit chip area while maintaining the 1 nanosecond rise time (300 mHz) objective.

Ring Counter Rise Time

Figure 7:
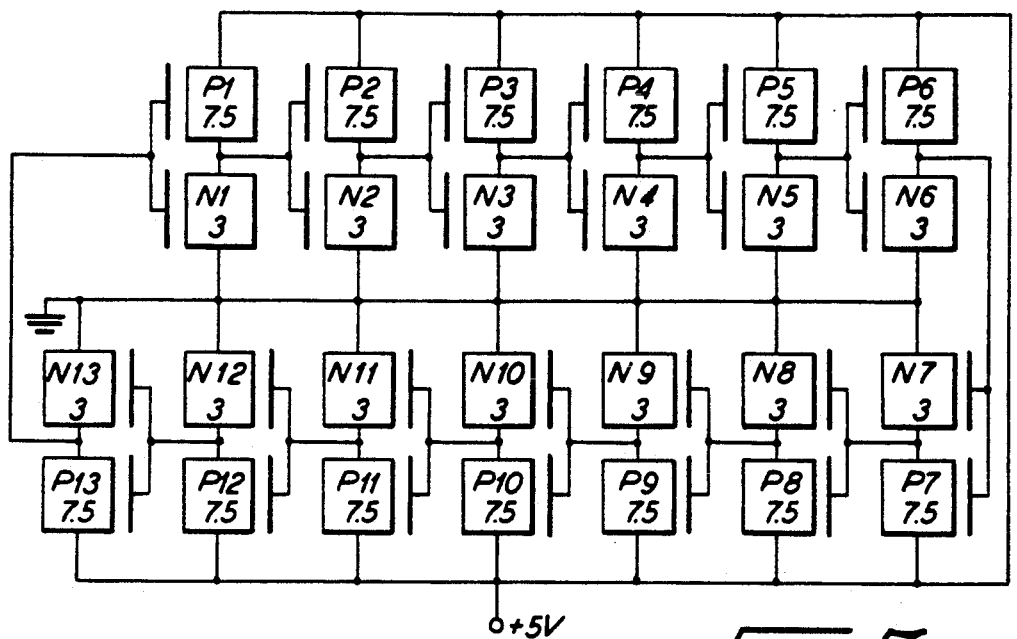
FIG. 7 illustrates a thirteen stage CMOS ring counter.

Referring now to FIG. 7, a ring counter is illustrated. A ring counter consists of an odd number (13 in FIG. 7) of CMOS inverters. Each inverter comprises a pair of complementary FETs $N_n$ and $P_n$ (n=1 ... 13) serially connected between two electrical potentials (here shown as ground and 5 Volts). The inverters are interconnected such that the output of an inverter stage (i.e. the common connection point between the serially connected FETs) is connected to the input of the following inverter stage. The output of the final stage 13 is connected to the gate inputs of the first stage 1.

As shown in FIG. 7, the P-channel transistors have a channel width which is $\eta$ times that of the N-channel transistor due to lower hole mobility. In other words, the hole mobility in the P-channel FET is $\eta$ times lower than the hole mobility of the N-channel FET. In order to provide a symmetric invert transfer function, the channel width of the P-channel devices is increased by $\eta$. Thus, for example, if the N-channels are all 3 $\mu$m wide, the P-channels are all 7.5 $\mu$m wide assuming $\eta = 2.5$ (a common value for silicon). Therefore the effective gate width of an inverter is $(1+\eta)Z_n$.

Analysis of the ring counter starts with the expression previously derived for inverter response time:

$$T_{rise} = \frac{2CV_{dd}}{I} \quad (15)$$

Where;
C = Load Capacity in Farads
$V_{dd}$ = Power supply voltage
I = Channel current Load capacity C on each inverter output stage consists of gate, diffusion, and interconnect capacity and is written as follows:

$$C = C^*_g(1+\eta)(Z_oL_o) + C_i(W_cL_c) \quad (22)$$

Where $$C^*_gC_g + \xi C_d(\text{Farads}/cm^2) \quad (23)$$

and $$\xi = \frac{L_d}{L_o}$$

$C_g$ = Gate capacity F/cm$^2$
$C_d$ = Diffusion capacity F/cm$^2$
$L_d$ = Length of diffusion region (cm)
$L_o$ = Channel length (cm)
and $W_c$ and $L_o$ are interconnecting conductor width and total effective conductor length, respectively. Let $$W_c = \beta Z_o \quad (24)$$

and $$L_c = \alpha L_o \quad (25)$$

Where $Z_o$ and $L_o$ are the width and length of the N-channel transistors comprising the inverters forming the ring counter.
Substitution yields:

$$C = Z_oL_o(C^*_g(1+\eta) + C_i\alpha\beta) \quad (26)$$

Next, a specific value for $\alpha$ is found. This is done by equating effective gate capacity with interconnect capacity:

$$C^*_g(1+\eta)Z_oL_o = C_i\alpha\beta Z_oL_o \quad (27)$$

Solving for $\alpha$:

$$\alpha_o = \frac{C^*_g(1+\eta)}{C_i\beta} \quad (28)$$

This value of $\alpha$ occurs when gate and distributed capacity are equal. We can rewrite Equation (26) to reflect the above. Total inverter load capacity becomes:

$$C = Z_oL_oC^*_g(1+\eta)\left(1 + \frac{L_c}{\alpha_oL_o}\right) \quad (29)$$

When conductor length $L_c = \alpha L_o$, inverter load capacity is exactly twice the effective gate capacity. Substituting Equation (29) and defining $I = I^*_{sat}(Z_o/L_o)$, a fundamental expression for rise time in each stage of a ring counter is obtained:

$$\text{Ring, } T_{rise} = \frac{2V_{dd}L_o^2C^*_g(1+\eta)\left(1 + \frac{L_c}{\alpha_oL_o}\right)}{I^*_{sat}} \quad (30)$$

Note that Equation (30) is independent of the P- or N-channel width used in constructing the ring counter inverters. This fact comes about by the definition of conductor width, $W_c$ in Equation (24).

The rise time of a typical Ring Segment Buffer may be calculated for the following conditions:

$C^*_g = 1.5e-7$ Farads/cm2
$\eta = 2.5$
$C_1 = 3.34e-9$ Farads/cm2

$\beta = 0.5$

From Equation (28):

$\alpha_o = 300$

Assuming a pessimistic case when $L_c = \alpha_o L_o$, Equation (30) yields a ring counter stage rise time of 0.42 ns given $V_{dd} = 5$ V, $I^*_{sat} = 0.25$ ma and $L_o 1$ μm. The minimum inverter rise time for these circumstances is 0.21 ns given no distributed load capacitance.

The rise time of a ring counter inverter stage is primarily controlled by the length of the FET channel $L_o{}^2$. This can be seen by examining Equation (30).

Figure 8:
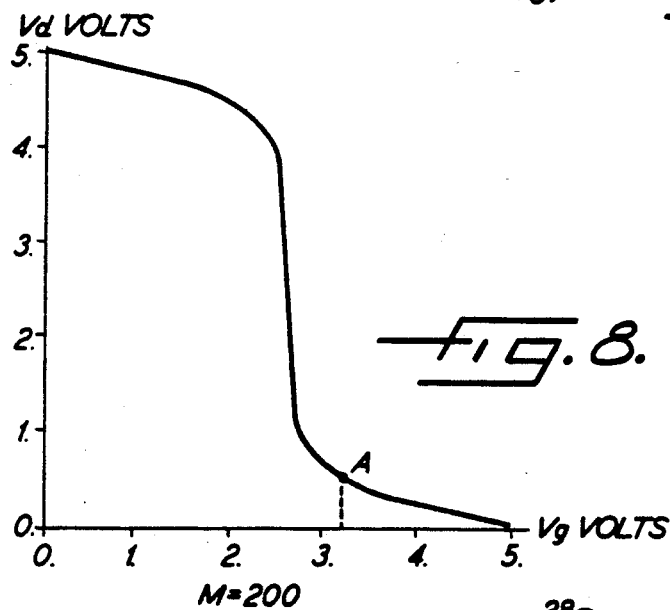
FIG. 8 graphically illustrates a symmetrical voltage transfer function of an inverter.

Each stage of the ring counter of FIG. 7 consists of identical CMOS inverters each of which should have a symmetric voltage transfer function. The voltage transfer function for a CMOS inverter with symmetrical design is illustrated in FIG. 8. The ordinate of FIG. 8 is inverter output voltage at the common drain connection. The abscissa is gate voltage common to both gates of the P-channel and N-channel transistors forming the inverter.

FIG. 8 illustrates the fact that the input gate voltage must reach more than 50% of the drain supply voltage before the inverter can transfer channel current to the load when the low frequency output voltage drops rapidly to point A in the figure. This property of a CMOS inverter accounts for a majority of the delay time between the input and output voltage signals. In fact, this delay time corresponds closely to 65% of the rise time of the gate input signal. The total delay time produced by n inverters comprising the ring counter (n is odd) accounts for the ring counter toggle rate. Thus the toggle frequency $f_{ring}$ of a ring counter may be expressed as follows:

$$f_{ring} = \frac{I^*_{sat}}{4N(.65)(1 + \eta)C^*_g L_o{}^2 V_{dd}\left(1 + \frac{L_c}{\alpha_o L_o}\right)} \quad (31)$$

The Ring Segment Buffer

The process of sampling the ring counter toggle frequency may be used to illustrate the reasoning behind the need for the Ring Segment Buffer of the present invention. Referring again to FIG. 7, a fundamental problem is how to measure or sample the electrical signals occurring within the ring counter without disturbing its intrinsic toggle frequency (Equation (31)). Any sampling means attached to the output terminal of the ring counter introduces capacitive loading. The same conditions apply to sampling a logic cell or memory cell to extract its signal. The result of sampling the ring counter is an increase in rise time at the sample point resulting from the capacitive loading effects of the sampling means. This increase in rise or fall time at the sampling point proportionately increases delay in turning the next stage of the ring counter on or off. Accordingly, the ring counter toggle frequency is slowed down by twice the increase in rise time at the sample point.

It is convenient to express load capacity of a sampling inverter in terms of the effective gate capacity per unit area $C^*_g$ of the N-channel device in the ring counter, logic cell or memory cell. When the sampling load capacity equals this capacity, the rise or fall time of the cell being sampled is doubled from its intrinsic value. The effective input gate capacity (in Farads) of the ring inverter or logic cell being sampled is:

$$C = C^*_g\left(Z_o L_o(1 + \eta)\right)\left(1 + \frac{L}{\alpha_o L_o}\right) \quad (32)$$

where $Z_o$ and $L_o$ are the channel width and length of the N-channel transistor in the ring counter inverter, logic cell or memory. $\eta$ is the factor that accounts for the larger gate area of the P-channel device forming the CMOS structure. The P-channel gate area is larger because hole mobility is less than electron mobility in the N-channel device. For silicon $\eta \approx 2.5$ for symmetric inverter designs.

A suitable sampling means for the ring counter is a CMOS inverter. The fundamental question now is, how much capacity is the sampling inverter or buffer going to drive and what rise or fall time is required at its loaded output? The Ring Segment Buffer samples fast logic signals with nominal loading effects of the intrinsic logic signal response time while maintaining flexibility in driving large capacitive loads. The Ring Segment Buffer is illustrated in FIG. 9.

Figure 9:
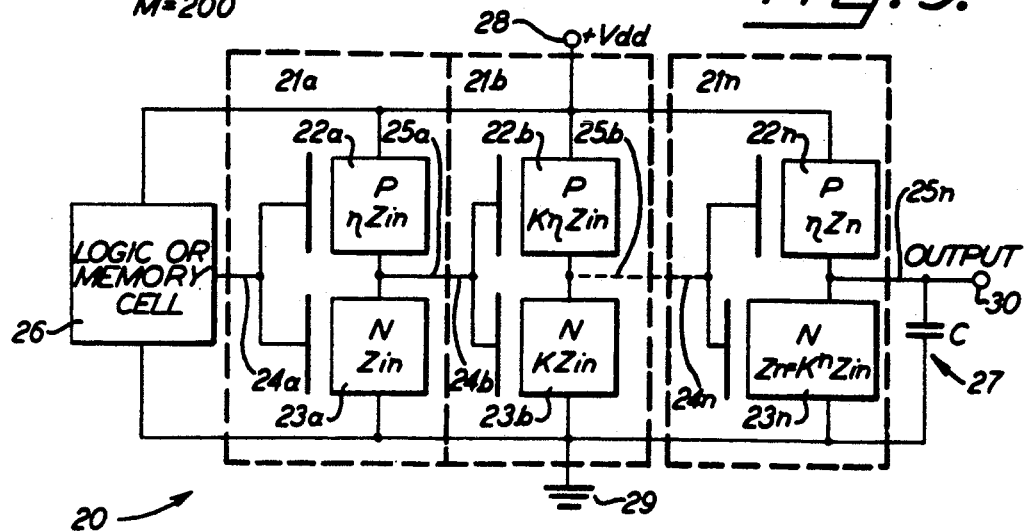
FIG. 9 illustrates a Ring Segment Buffer according to the present invention.

Referring now to FIG. 9, the Ring Segment Buffer 20 of the present invention comprises a plurality of serially connected complementary FET inverter stages 21a... 21n, each of which comprises a P-channel FET 22 and an N-channel FET 23 the sources and drains of which serially connected between a first electrical potential 28 (for example, power supply potential $+V_{dd}$) and a second electrical potential 29 (for example ground potential). The input 24 of each inverter, formed by connecting together the gates of the complementary FET inverter, is connected to the output 25 of the immediately preceding inverter, where the inverter output 25 is the connection point between the serially connected complementary FETs 22 and 23. The input 24 of the first stage is connected to the logic or memory cell 26, the output of which is to be driven by the Ring Segment Buffer 20. The output 25n of the last stage 21n of the Ring Segment Buffer is connected to the output connections 30 for the logic or memory cell 26. In other words, Ring Segment Buffer 20 is placed between logic or memory cell 26 and its output connection 30.

As shown in FIG. 9, the load at output 30 is represented by an effective capacitance C 27. According to the present invention, the Ring Segment Buffer 20 is designed to drive load capacitance 27 at the desired toggle frequency. This may be achieved according to the invention, by designing the channel width of each N-channel FET 23 to be a factor K or less, greater than the N-channel width of the immediately preceding N-channel FET. Accordingly, as shown in FIG. 9, the logic or memory cell is constructed of N-channel FETs having channel width $Z_{in}$. The N-channel FET 23a of the first buffer stage 21a also has width $Z_{in}$. The second stage 23b has width $KZ_{in}$, the third stage has width $K^2 Z_{in}$ and the final stage 21n has width $K^n Z_{in}$. The corresponding P-channel FETs 22a... 22n have width $\eta Z_{in}$, $K\eta Z_n$ and $K^n \eta Z_n$ with $\eta$ being the mobility difference factor. This guarantees that each stage has a symmetric voltage transfer function.

Derivation of the factor K for the Ring Segment Buffer will now be described. It will be shown that when factor K is observed between Ring Segment Buffer stages, the Ring Segment Buffer can drive an arbitrarily sized capacitive load C, with the desired high speed operation of the logic or memory cell circuit.

The analysis begins by finding the equivalent gate width $Z_{el}$ for a general output capacitive load C (27) in Farads:

$$Z_{el} = \frac{C}{C^*_g L_o} \qquad (33)$$

The width of the N-channel transistor in the last stage of the Ring Segment Buffer is defined as $Z_n$ (where $Z_n = K^n Z_{in}$):

$$Z_n = F_R Z_{el} = \frac{2 L_o V_{dd} C}{I^*_{sat} T_{rise}} \qquad (34)$$

According to the invention, the N-channel width of each inverter stage in the Ring Segment Buffer will be a factor K greater than the previous stage. All channel lengths can be the minimum value $L_o$. The required output signal rise time, $T_{rise}$, the channel width $Z_o$ in the logic cell and the Ring Segment Buffer polarity determine the value of K and the number of stages n required by the buffer cell. The P-channel transistor 22 in each inverter comprising the Ring Segment Buffer has a width $\eta$ times the width of the corresponding N-channel transistor due to lower hole mobility. Therefore, the effective channel width of the output inverter being driving by the preceding stage $n-1$ is $(1+\eta)Z_n(1+L/(a_o L_o))$. Now, the condition that allows $Z_n - 1 = Z_n/K$ must be found. This condition is satisfied when $$F_R = \frac{1}{K(1+\eta)\left(1 + \frac{L}{a_o L_o}\right)} \qquad (35)$$

Therefore from Equation (21):

$$\frac{2 C^*_g L_o^2 V_{dd}}{I^*_{sat} T_{rise}} = \frac{1}{K(1+\eta)\left(1 + \frac{L}{a_o L_o}\right)} \qquad (36)$$

Solving for K:

$$K = \frac{I^*_{sat} T_{rise}}{2(1+\eta) C^*_g L_o^2 V_{dd} \left(1 + \frac{L}{a_o L_o}\right)} \qquad (37)$$

Where;
 $I^*_{sat}$ is the square channel saturation current,
 $T_{rise}$ is the desired rise time,
 $\eta$ is the hole mobility difference,
 $C^*_g$ is the equivalent gate capacitance of the load,
 $L_o$ is the channel length,
 $V_{dd}$ is the power supply voltage,
 $L_c$ is interstage conductor length, and
 $a_o$ is the effective interconnect capacitive loading factor.

For a given output rise time objective $T_{rise}$, it is desired that K have as large a value as possible. This requires FET devices with low gate capacity $C^*_g$ and short channel length $L_o$.

In order to evaluate K for a typical Ring Segment Buffer, assume:
 $I^*_{sat} = 2.5e-4$ Amps,
 $T_{rise} = 1e-9$ sec,
 $\eta = 2.5$,
 $C^*_g = 1.5e-7$ F/cm$^2$,
 $L_o = 1e-4$ cm,
 $V_{dd} = 5$ Volts, and
 $L/a_o L_o = 0.2$ Substituting the above values into Equation (37), the value K=4.0 is obtained. Thus for the conditions assumed, the channel widths of successive N-channel stages of the Ring Segment Buffer may be increased by factor K=4 to support a rise time of 1 ns at the output and at the gate input of each stage of the Ring Segment Buffer.

The width $Z_o$ of the N-channel transistor in the logic cell or memory cell in order to drive the N stage Ring Segment Buffer may be calculated using Equations (33) and (34):

$$Z_{el} = \frac{C}{C^*_g L_o} \qquad (33)$$

$$Z_n = F_R Z_{el} \qquad (34)$$

Therefore:

$$Z_n = F_R \frac{C}{C^*_g L_o} \qquad (38)$$

For an N stage Ring Segment the expression defining the channel width $Z_{in}$ of the first stage is:

$$Z_{in} = \frac{F_R}{K^{(N-1)}} \frac{C}{C^*_g L_o} = \frac{Z_n}{K^{(N-1)}} \qquad (39)$$

For example, assuming
 C=2e-12 Farads (Load Capacity),
 $C^*_g = 1.5e-7$ F/cm$^2$,
 $L_o = 1e-4$ cm,
 $V_{dd} = 5$ Volts,
 $I^*_{sat} = 2.5e-4$ Amps,
 $T_{rise} = 1e-9$ sec,
Then using the above values:
 $F_R = 0.06$
 $Z_{el} = 1333.2$ $\mu$m
 $Z_n = 80.0$ microns
 K=4.0
 $Z_{in} = 5$ microns for N=3

Thus, the first stage of the Ring Segment Buffer of this example requires an N-channel width of 5 $\mu$m ($Z_{in}$), the second stage requires 20 $\mu$m ($KZ_{in}$) and 80 $\mu$m ($K^2 Z_{in} = Z_n$) for the final stage. With this three stage Ring Segment Buffer, a 2 pF load capacity can be driven with a rise or fall time of 1 ns, with nominal effect on the originating logic cell or memory cell signal response time. If the N-channel width of the logic cell transistor has the same value computed for $Z_{in}$, the rise time of the input signal of the Ring Segment Buffer corresponds to that value computed for a ring counter (Equation (16)). This input rise time will be approximately K times faster than the output response time of the Ring Segment Buffer driving load capacitance C.

The N-channel width of the driving logic cell should never be less than factor 1/K times the width $Z_{in}$ of the first stage of the Ring Segment Buffer. In other words, factor K determines the relationship between the channel width of N-channel device in the first stage of the Ring Segment Buffer and the channel width of the N-channel device in the memory or logic circuit being driven by the Ring Segment Buffer.

If one attempts to use a single stage Ring Segment Buffer to couple the output of a memory cell or logic cell to a load capacity and K is greater than that defined by Equation (37), then the rise time or fall time is increased approximately by the ratio of $Z_n/Z_o$ based on the rise time of the unsampled driving logic cell. Rise or fall delay time is also proportional to this ratio of channel widths. For example, if $Z_o = 4$ μm and the single stage Ring Segment Buffer has a channel width $Z_n = 80$ μm; i.e., K=20. Then the output signal will have a rise time 20 times as long as the intrinsic rise time of the unsampled logic cell.

Clearly the loading effect of even a single stage Ring Segment Buffer is unsatisfactory unless factor K is observed. If one exceeds K, the permissible system clock rate is dramatically reduced. Factor K specifies the maximum channel dimensions of a single stage Ring Segment Buffer, based on the N-channel dimension in the logic cell that can be used to support the specified input and output rise or fall times. A plural stage Ring Segment Buffer is required to buffer the logic cell from large capacitive loads.

Summary of Design Procedure for Ring Segment Buffer

The above analysis for designing a Ring Segment Buffer to drive a capacitive load at high speed will now be summarized.

Step 1: The minimum gate width of the N-channel device in the last stage of the Ring Segment Buffer to drive the effective capacitance C is determined. This width is $Z_n$ of Equation (34).

Step 2: The maximum value of K is determined from Equation (37).

Step 3: The maximum gate width ($Z_{in}$) of the N-channel device in the first stage of the Ring Segment Buffer is determined by using Equation (39). This is the nominal $KN_{CELL}$ where $N_{CELL}$ is the N-channel width of the logic or memory cell driving the Ring Segment Buffer.

Step 4: Based upon the channel width of the first stage (Step 3) the last stage (Step 1) and K (Step 2), the number of stages N necessary for the Ring Segment Buffer is determined.

Step 5: The P-channel width for each stage is $\eta$ times the corresponding N-channel width.

It will be understood by those having skill in the art that other considerations may factor into the determination of the number of stages. For example, it may be decided that an even number of stages should be provided in the Ring Segment Buffer so that the input signal is not inverted. Alternatively, an odd number of stages may be desired for an inverting Ring Segment Buffer. Additional stages may be provided to account for normal production tolerances. Therefore, more stages may be provided then is necessary from Step 4.

INTEGRATED BIPOLAR TRANSISTOR—FIELD EFFECT TRANSISTOR DRIVERS

The devices described below can handle large loads such as off chip loads or long clock buss lines having capacitance in excess of 1 pF. As described below, the BIFET can be used as a single stage Ring Segment Buffer or in combination with a multistage Ring Segment Buffer. When used in combination with the Ring Segment Buffer, the BIFET preferably forms the last stage of the Ring Segment Buffer. The BIFET buffer is a non-inverting device.

A typical BIFET driver can enhance the load driving capabilities of the Ring Segment Buffer at rise or fall times of 1ns or less by a factor of about six. Accordingly, a fourfold reduction in channel width, from that described above for the Ring Segment Buffer, may be obtained. The delay introduced by the BIFET driver is about 20% of the input rise or fall time. A pair of complementary BIFET drivers may be integrated into a BICMOS driver.

According to the invention, the bipolar transistors in BIFET and BICMOS drivers must be a "Lifetime Controlled" bipolar transistor as described below. No DC power is consumed by this buffer technology.

Referring now to FIG. 10, a BICMOS buffer 50 comprises a complementary FET inverter 40, the output 52 of which is connected to the input 51 of a Lifetime Controlled complementary bipolar transistor emitter follower 41. Both FET inverter 40 and emitter follower 41 are connected between first potential source 46 (e.g. +5 V) and second potential source 47 (e.g. ground). Input 49 is applied to the common gates of FETs 42 and 43, while output 54 is obtained from the common emitters 55 of bipolar transistors 44 and 45, via optional current limiting resistor 48. It will be seen that BICMOS driver 50 as configured is inverting from input 49 to output 54. BICMOS driver 50 comprises P-channel BIFET driver 42 and 44 and N-channel BIFET driver 43 and 45.

Figure 12A:
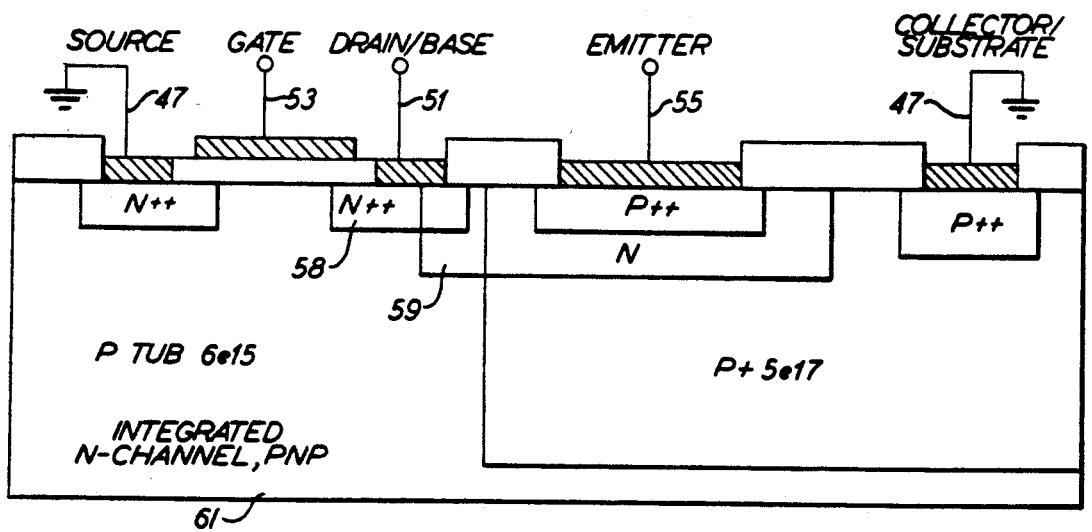
FIGS. 12a and 12b illustrate a cross section of an integrated circuit N-channel BIFET driver according to the present invention.
Figure 12B:
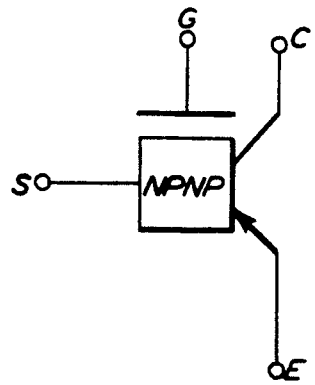

Referring now to FIG. 11A, the cross section of the P-channel BIFET driver comprising P-channel FET 42 and NPN transistor 44 is shown. In FIG. 11A, the P-channel FET's drain diffusion 45 is coupled directly to the base 57 of an NPN, Lifetime Controlled bipolar transistor. FIG. 12A illustrates the cross section of the N-channel BIFET driver comprising the N-channel FET 43 and PNP transistor 45 of FIG. 10. In FIG. 12A the N-channel FET's drain diffusion 58 is coupled directly to the base 59 of a PNP, Lifetime Controlled bipolar transistor. In both cases, the substrate 60, 61 for the FETs is the collector of the bipolar transistors. FIGS. 11B and 12B show the electrical symbols for the P-channel BIFET and N-channel BIFET of FIGS. 11A and 11B, respectively.

Figure 13:
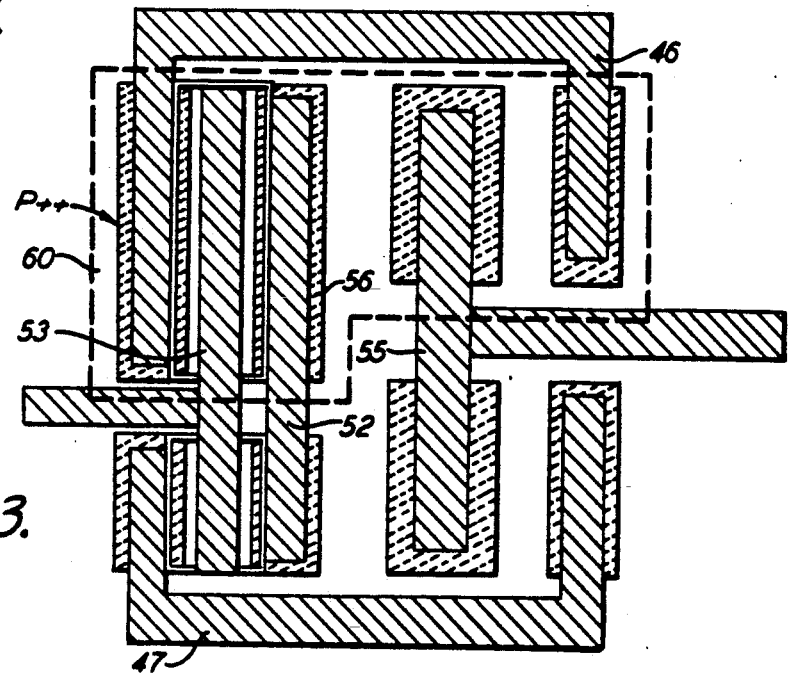
FIG. 13 illustrates a top view of an integrated circuit BICMOS buffer according to the present invention.

FIG. 13 illustrates the top view of the BICMOS integration of the N-channel and P-channel BIFETs. The BICMOS buffer is capable of driving high capacitive loads while greatly minimizing chip real estate needed to achieve this goal. The theory behind the BIFET/BICMOS buffer will be presented below.

According to the invention, to achieve signal rise and fall times of 1 nanosecond or less, at the capacitive load output terminal of the BICMOS buffer, the minority carriers within the silicon base regions 57, 59 (FIGS. 11A and 12A respectively) of the bipolar transistors must be lowered from the typical value of 5e−7 sec to 8e−9 sec or less. Narrow base techniques are also required. Reduction in lifetime must be achieved while maintaining a current gain β of 20 or more.

The critical step of lowering carrier lifetime is accomplished during wafer fabrication by doping the base regions 57, 59 of the bipolar transistors with gold. The purpose of the gold is to introduce paired donor and acceptor recombination centers within the base regions 57, 59 with energy states within the middle of the bandgap.

BICMOS Buffer Theory

For the BICMOS circuit of FIG. 10, total load capacitance C is expressed as follows:

$$C = \frac{C_l}{1 + \beta(t)} \quad (40)$$

Where;

C* is the transition capacity at the input of the bipolar transistors $\beta(t)$ is the time dependant current gain of the bipolar transistors $\tau_o$ = Base recombination life-time (lifetime) of minority carriers The time-constant $\tau_o$ for the BICMOS structure is:

$$\tau_o = \left( \frac{C_l}{1 + \beta_o(1 - e^{-\frac{t}{\tau_p}})} + C^* \right) \frac{V_{dd}}{I_{sat}} \quad (41)$$

Emitter current is expressed as:

$$I_E(t) = I_B(t)[1 + \beta_o(1 - e^{-\frac{t}{\tau_p}})] \quad (42)$$

Base current is expressed as:

$$I_B(t) = I_{sat}\left[1 - \left(\frac{1}{M}\right)^{\frac{1}{\ln(M)}\ln[\frac{M\frac{1}{\tau_o} + M(1-\frac{1}{M})}{M\frac{1}{\tau_o}}]}\right] \quad (43)$$

Figure 14:
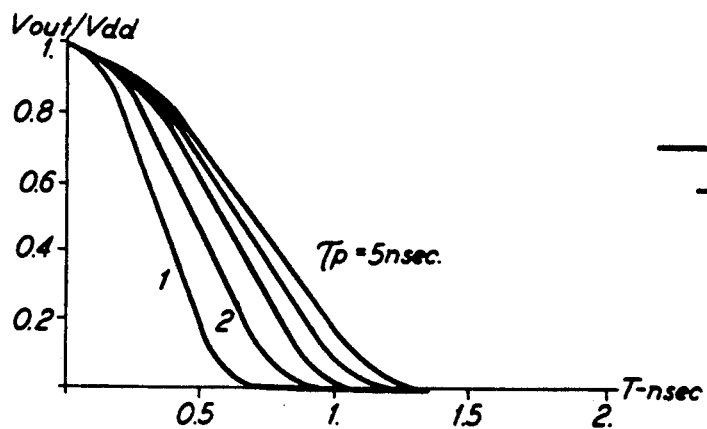
FIG. 14 graphically illustrates the fall time of the BICMOS buffer of FIG. 10.

Time constant $\tau_o$ described by Equation (41) must be used in this expression. FIG. 14 is a computer generated plot of Equation (6) with Equation (41) used for the time constant $\tau_o$ with a range of values for the Lifetime Controlled base recombination lifetime $\tau_p$ as a running parameter. It is shown in FIG. 14 that the fall time of the BICMOS buffer is about 6 times less than the value attained by the inverter alone given the same capacitive loading and 1 ma drain current. A 1 ns fall time can be achieved given a drain-base current of 1 ma, a bipolar transistor with $\beta$ of 20 and a base region lifetime $\tau_p$ of 2 ns.

Figure 15:
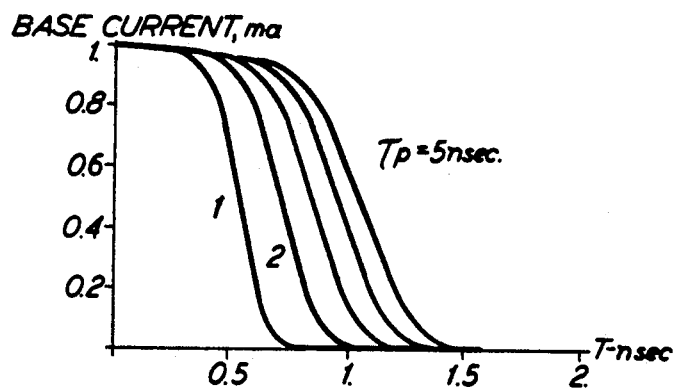
FIG. 15 graphically illustrates the drain-base current of the BICMOS buffer of FIG. 10.

FIG. 15 is a plot of drain-base current as a function of time t for the BICMOS buffer with lifetime as the running parameter.

Figure 16:
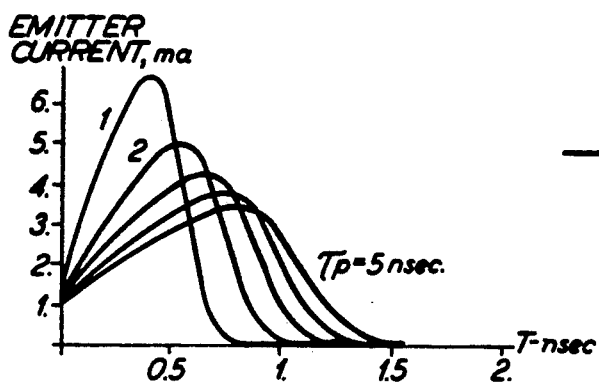
FIG. 16 graphically illustrates the emitter current of the BICMOS buffer of FIG. 10.

FIG. 16 is a plot of emitter current as a function of time with lifetime $\tau_p$ as the running parameter for the same base drive current of 1 ma and a load capacity of 1 pF. It is apparent from FIG. 14 that there is a rise and fall delay time introduced by the complementary lifetime controller bipolar transistor emitter follower. This delay is produced by recombination lifetime $\tau_p$ and is typically 15% to 20% of the circuit rise or fall time. By comparison, a symmetric complementary inverter introduces a delay time equal to 65% of the gate signal rise-time.

Referring to FIG. 16 it is shown that the peak emitter current increases rapidly for decreasing lifetime $\tau_p$. For short lifetimes and $\beta$=20, the peak emitter current is about 6 times as great as base current.

The BICMOS buffer offers significant benefits when driving large capacitive loads and response times of 1 ns or less are required. For capacitive loads of about 1 pF, the N-channel gate area of the driving logic circuit need not be greater than $3 \times 10^{-8}$ square cm. When it is desired to drive large capacitive loads, the recombination lifetime of minority carriers in the Lifetime Controlled bipolar transistor's base region must have a value no greater than 10 times the desired rise or fall time of the output signal. Optimum BICMOS buffering occurs when rise-time and lifetime are equal.

As pointed out earlier, gold doping the lifetime controller bipolar transistor base region is used to linearly control recombination lifetime. A minimum gold doping density of $10e^{15}$ is preferred. Lifetimes as low as $2 \times 10^{-10}$ sec may be achieved with gold density of $10e17$ cm$-3$.

With 1 ns response time objectives and lifetime of 2 ns, the speed enhancement factor per unit base current is $\beta_o/3.25$. For example if $\beta$=20, the speed enhancement factor is 6.15.

The chip area consumed by the complimentary emitter follower is much less than the FET gate area required by a CMOS inverter designed to do the same job. The BICMOS buffer technology is totally consistent with the basic premise that no DC power dissipation is permitted in the logic system at any toggle rate.

BICMOS Buffer As A Ring Segment Buffer

The BICMOS buffer technology described above may be used by itself as a one stage Ring Segment Buffer, with the channel width of the N-channel transistor being derived from Equation (34) as follows:

$$Z_n = \frac{L_o V_{dd} C}{3I^*_{sat} T_{rise}} \quad (44)$$

A fourfold reduction in area of the N-channel FET is obtained.

The BICMOS buffer technology may also be used as the last stage of a Ring Segment Buffer, for driving large capacitive loads. In that case, the channel width ($Z_n$) of the last stage N-channel device is reduced by a factor of about 6. This is particularly important for large loads where the last Ring Segment Buffer stage N-channel is very wide. Substitution of the BICMOS driver for the last stage of the Ring Segment Buffer allows a large reduction in area.

FIG. 17 illustrates an Ring Segment Buffer 70 with a BICMOS driver as the last stage. Referring to FIG. 17, it may be seen that the width of the last stage N-channel FET 43 is reduced to $K^n Z_{in}/6$ and the width of the last stage P-channel FET 42 is reduced to $K^n \eta Z_{in/b}/6$, a factor of 6 in both cases. More manageable device sizes are thereby obtained.

SYMMETRICAL CMOS LOGIC FUNCTION

Referring now to FIG. 18, a CMOS logic gate having a symmetrical transfer function according to the invention is shown. Logic gate 100 is configured as a well known CMOS three input NAND gate having three parallel P-channel MOSFETS 101A, 101B and 101C, connected between a first potential source 102 (e.g. power supply potential $V_{DD}$) and a common output point 103. Three N-channel MOSFETs 104A, 104B and 104C are serially connected between common point 103 and a second potential source 105 (e.g. ground potential). Each of inputs A, B, C is connected to the gate of a corresponding one of the parallel transistors 101A, 101B and 101C respectively, and the serial transistors 104A, 104B, 104C respectively. As previously described, in order to compensate for the differing hole mobility in N- and P-channel devices, the width of the P-channel channel devices 101 is increased over the N-channel devices by $\eta$, the hole mobility factor.

It has been found, according to the invention, that connecting transistors in series (Fan-In) diminishes their combined current drive capabilities in proportion to the number "m" connected in series. Since the CMOS NAND and NOR gates form an inverter, the inverter voltage transfer function (FIG. 8) will be skewed unless the channel width of the series transistors is increased by a number equal to m, the number of transistors connected in series.

Drive current capabilities of FET devices is proportional to the ratio $Z/L_o$ of channel width Z and channel length $L_o$. Since current is proportional to channel width Z, the size of the FET transistor must increase in proportion with its output current requirements.

Accordingly, to provide a symmetric transfer function in the three-input NAND gate shown in FIG. 18, the channel width Z of the N-channel (inverter equivalent devices) is increased by 3 to 3 Z. Similarly, for a NOR gate, the channel width of the serially connected P-channel devices is increased in the number m of devices. A symmetric transfer function is important to high clock rate systems.

BUFFER CELL LOGIC

As described above, CMOS logic is limited to speeds of about 70 mHz. In order to design high speed logic, which operates at 300 mHz or above, according to the invention, a Buffer Cell Logic is provided. FIG. 19 illustrates an overview of Buffer Cell Logic.

Referring to FIG. 19 an integrated circuit logic chip 110 includes a plurality of interconnected logic gates 111 each of which has a predetermined number of logic gate inputs and a logic gate output, where the logic gate output of each gate is connected to the logic gate inputs of other gates to perform a predetermined logic function. According to the invention, each logic gate 111 includes a Ring Segment Buffer 112, coupled between the gate output and the load which the logic gate must drive.

It will be understood by those having skill in the art that the load of each logic gate may be represented by an effective capacitance, where the effective capacitance varies with the number of gate interconnections (Fan-Out), the length of the interconnection lines, the materials used for interconnections, whether the logic gate must drive an off chip logic gate or an on chip logic gate, and a number of other factors. According to the invention, each of the Ring Segment Buffers 112 are configured to drive the associated effective capacitance at a desired logic chip speed. Accordingly, the logic chip may perform the predetermined logic function at the desired logic chip speed notwithstanding the associated effective capacitance for each logic gate.

It will be understood by those having skill in the art that each Ring Segment Buffer 112 will be uniquely designed for each logic gate to drive the associated effective capacitance, according to the design methodology already described. According to the invention, a number of different Ring Segment Buffer embodiments may be used. Ring Segment Buffer 112 may be a multistage Ring Segment Buffer as illustrated in FIG. 9, with the logic cell 111 of FIG. 19 corresponding to the logic cell 26 of FIG. 9. A single stage Ring Segment Buffer may also be provided, depending upon the associated effective capacitance which is to be driven, so as to satisfy the factor K for the Ring Segment Buffer design. For small effective capacitances, a single stage Ring Segment Buffer may be sufficient. For larger effective capacitances, a multistage Ring Segment Buffer may be needed.

It will also be understood by those having skill in the art that an odd or even number of stages may be provided in the Ring Segment Buffer in order to provide an inverted logic signal or a non-inverted logic signal, respectively, at the Ring Segment Buffer output. By using an odd number of stages in the Ring Segment Buffer, negative logic (NAND/NOR) CMOS may be converted to positive logic (AND/OR).

For high effective capacitances (greater than 1 pf) a BICMOS Ring Segment Buffer may be provided as buffer 112 FIG. 19. The BICMOS buffer is illustrated in FIG. 10, with the input 49 of FIG. 10 being coupled to the logic gate outputs of FIG. 19.

Finally, the buffer of FIG. 19 may be a Ring Segment Buffer having a BICMOS buffer for its last stage, as illustrated in FIG. 17. Accordingly, in FIG. 17 the logic cell 26 corresponds to the logic cell 111 of FIG. 19. The Ring Segment Buffer with a BICMOS output driver may be used with the highest capacitive loads.

Figure 20:
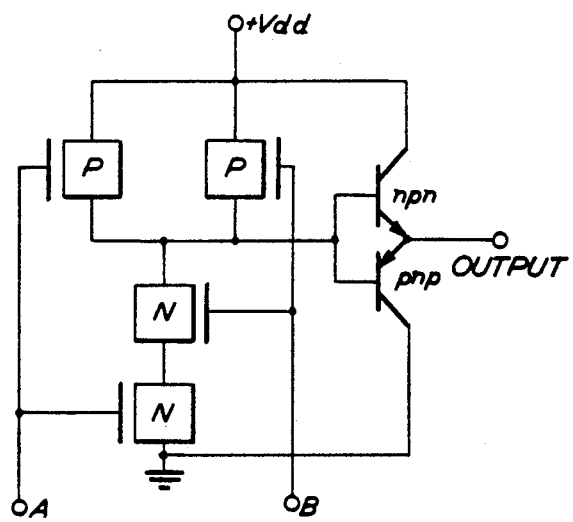
FIGS. 20-23 illustrate CMOS logic gates having BICMOS outputs according to the present invention.
Figure 21:
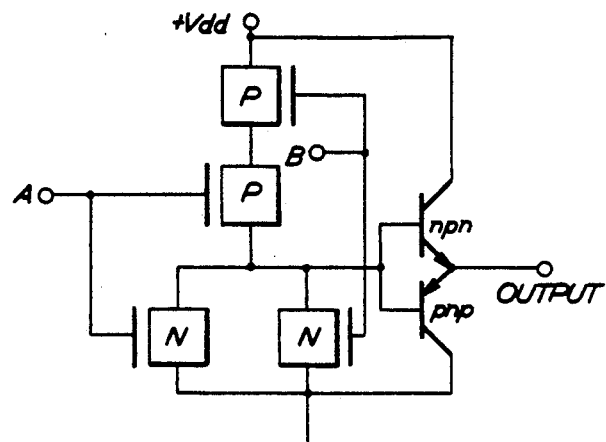
Figure 22:
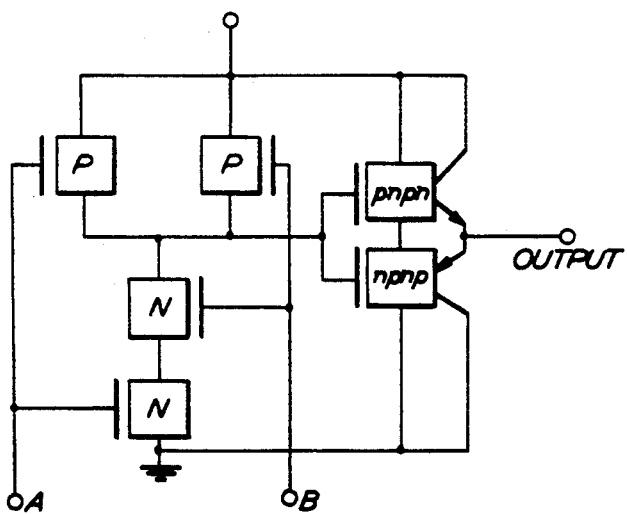
Figure 23:
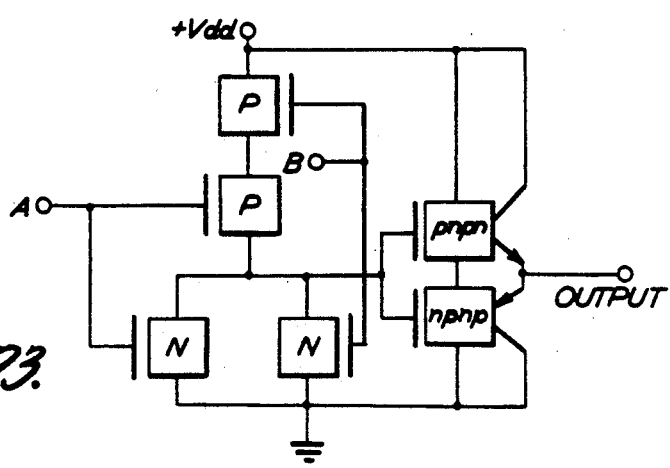

Referring now to FIGS. 20-23 a number of CMOS logic gates having BICMOS outputs are shown. Having already described CMOS logic and the BICMOS buffer, these gates need not be described in detail. FIG. 20 illustrates a CMOS NAND gate which is directly coupled to a complementary Lifetime Controlled bipolar junction transistor emitter follower. The emitter follower configuration buffers the logic cell output from effective capacitive loading while preserving the NAND logic function. This buffered NAND gate may be integrated in silicon using the same technique described in connection with FIGS. 11A, 12A and 13. FIG. 21 illustrates a Lifetime Controlled bipolar transistor emitter follower buffered NOR gate. FIG. 22 illustrates a BICMOS buffered AND gate. The buffer cell in this circuit is inverting. FIG. 23 illustrates a BICMOS buffered OR gate.

The complementary logic circuits of FIGS. 20-23 are all capable of driving heavy capacitive loads with zero DC power dissipation, while maintaining a rise and fall time of 1 nanosecond or less. As described above, in all of the circuits of FIGS. 20-23, the channel width of the series connected transistors should be increased by a factor proportional to the number of transistors connected in series. This design procedure ensures that the base current delivered to the complimentary bipolar transistor emitter follower is independent of the switching state of the logic cell.

MEMORY CIRCUITS USING RING SEGMENT BUFFER

There are many logical functions needed in system design that require the use of static memory. For example, shift registers, triggers, binary counters and static random access memory, all require the use of static memory. To realize the high speed potential offered by Buffer Cell Logic described above, a single clock pulse is needed rather than two clock pulses to access storage. A double clock system inherently cuts the processor's rate in half, while greatly adding to the complexity of the clock circuits required to generate the high speed double clock system. However, it is well known to those having skill in the art that for a shift register to work properly, the present output of the shift register must be shifted to the next stage before a new value is stored in the shift register. Accordingly, shift registers have heretofore required two clock pulses; with the first clock pulse shifting out the present value of the shift register stage and the second clock pulse shifting in the new value into each shift register stage.

According to the present invention, the unique delay and power driving capabilities of the Ring Segment Buffer may be utilized in conjunction with memory circuits to provide a single clock pulse memory cell, as described below. A single clock pulse provides for shifting a new logic value into the memory cell while reading out the old logical value before the end of a predetermined delay governed by the Ring Segment Buffer. Also disclosed below, according to the invention, are memory based circuits that utilize the Ring Segment Buffer as a delay and load driving means for clock generators, delay latches and binary counters. The combination of a memory cell and a Ring Segment Buffer is referred to as "Delay Storage" technology.

The Delay Storage technology of the present invention allows single sampling clock pulses to be used internal or external of the Delay Storage cell. The internal clock approach is very powerful since much of the logic circuitry used by external clocking schemes is eliminated, offering a significant reduction in chip real estate while still providing a very high speed operation.

Time Delay Using Ring Segment Buffer

The Ring Segment Buffer of the present invention may be used as a well controlled time delay device referred to as a "Delay Ring Segment Buffer" The Delay Ring Segment Buffer not only provides delay but is also designed as a power driving means using the design methodology described above. This feature is uniquely utilized in the Delay Storage technology described below.

Delay time $T_d$ for the Ring Segment Buffer may be expressed as $T_d = 0.65nT_{rise}$, where $T_{rise}$ is the desired value used to compute the value of K (Equation (37)) and n is the number of Ring Segment Buffer stages.

Figure 24:
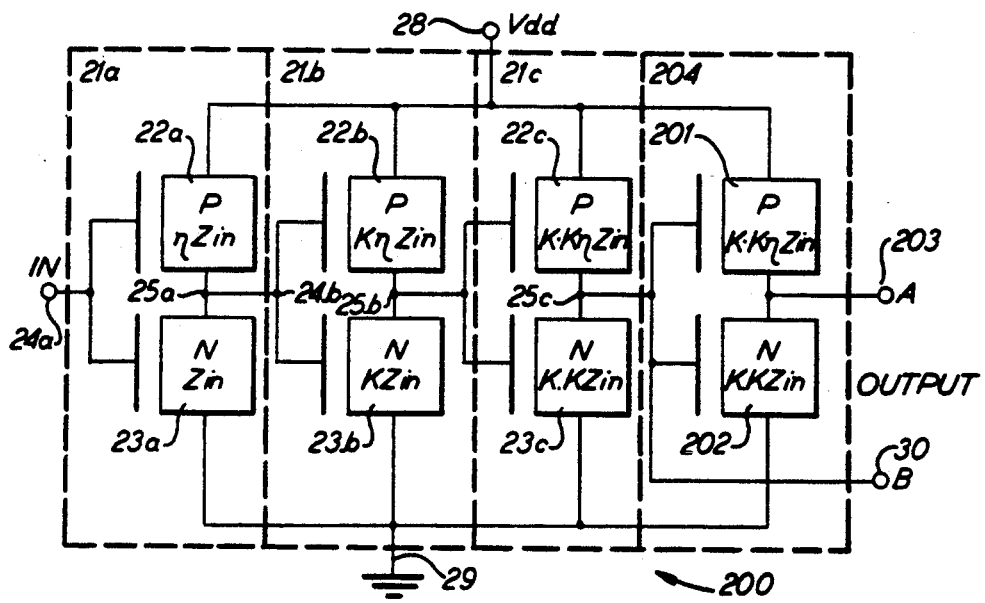
FIG. 24 illustrates a Delay Ring Segment Buffer having complementary outputs according to the present invention.

FIG. 24 illustrates a three stage Ring Segment Buffer configured to function as a time delay device. This delay device is also capable of driving substantial capacitive loading at both output terminals while maintaining 1ns rise or fall times. FIG. 24 corresponds to the Ring Segment Buffer illustrated in FIG. 9, except that an extra inverter 204, comprising P-channel FET 201 and N-channel FET 202, is coupled to the Ring Segment Buffer output 25C, to provide complementary signal outputs 30 and 203. The channel dimensions of the final inverter 204 may be the same as the last stage 21C of the Ring Segment Buffer. In other words, K=1 for the final inverting stage.

The input signal to the Ring Segment Buffer delay cell may be clock pulses, an input from a random access memory (RAM) cell, or some other digital signal. In the preferred embodiment, the input signal rise time should be in the low nanosecond range. The delay time $T_d$ of the output derived from the Ring Segment Buffer section giving rise to the delay, is shown below. This equation is valid if the channel dimensions of the Ring Segment Buffer input stage are equal to the channel dimensions of the driving logic cell:

$$T_d = 0.65NT_{rise} \quad (45)$$

where n is the number of stages in the Ring Segment Buffer (3 in FIG. 24) and $T_{rise}$ is the rise time selected for the inverters comprising the Ring Segment Buffer. Choosing this rise time specifies the value of K in Equation (37) that must be satisfied in the design of the Ring Segment Buffer delay cell.

The length $L_o$ of the P-channel and N-channel devices in the Ring Segment Buffer delay cell may be chosen to define a desired rise time to control delay for a given K. Or, for a given rise time, channel length $L_o$ may be chosen to obtain the desired value for K. The number n of stages may also be used to control delay time. Another virtue of the Ring Segment Buffer delay cell is that delay time is quite tolerant of supply voltage variations if the inverters are designed with symmetric voltage transfer functions, in a manner already described.

Delay Storage Technology Circuits

Figure 25:
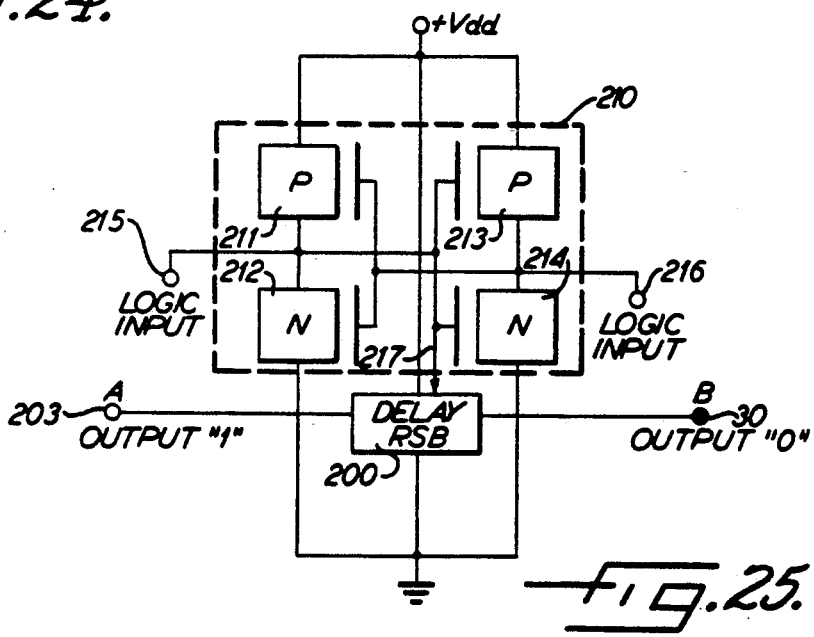
FIG. 25 illustrates a Delay Storage Technology circuit according to the present invention.

FIG. 25 illustrates the basic use of the Ring Segment Buffer as a delay device in combination with a RAM cell. RAM cell 210 comprises cross coupled pairs of FETs 211-214 to form a static memory cell in the manner well known to those having skill in the art. Complementary logic inputs 215 and 216 are provided, in the manner well known to those having skill in the art.

According to the invention, the output 213 of the memory cell 210 is connected to the input 24a of the Delay Ring Segment Buffer (Delay Ring Segment Buffer) 200 (FIG. 24). Output terminals A (203) and B (30) are shown in FIG. 25. The A terminal must follow positive logic ground rules and the B terminal, negative logic ground rules independent of n. For example, if a rising input signal of the RAM cell is coupled to the input of the Delay Ring Segment Buffer, then output A will rise and output B will fall after time delay $T_d$ occurs. Any known circuits may be used to logically control the state of the RAM cell 210.

According to the invention, the contents of the RAM cell 210 are provided at the outputs 203, 30 of the Delay Ring Segment Buffer 200 after a predetermined delay $T_d$, defined by Equation (45). Accordingly, if the contents of the memory cell 210 are changed at a time $T_o$, the output of the Delay Ring Segment Buffer 200 will not change until time $T_o + T_d$. Until time $T_o + T_d$, the old contents of the memory cell will be present at the outputs 203, 30 of the Delay Ring Segment Buffer. This allows the contents of the memory cell 203 to be changed with the old contents of the cell being available up to a time $T_d$ later. A shift register responsive to a single clock pulse may thereby be provided. In contrast with known shift registers, the output of which must be sampled before a new input value is stored therein, the shift registers of the present invention allow storing the new value first, while sampling the old value simultaneously, all using a single clock pulse.

Figure 26A:
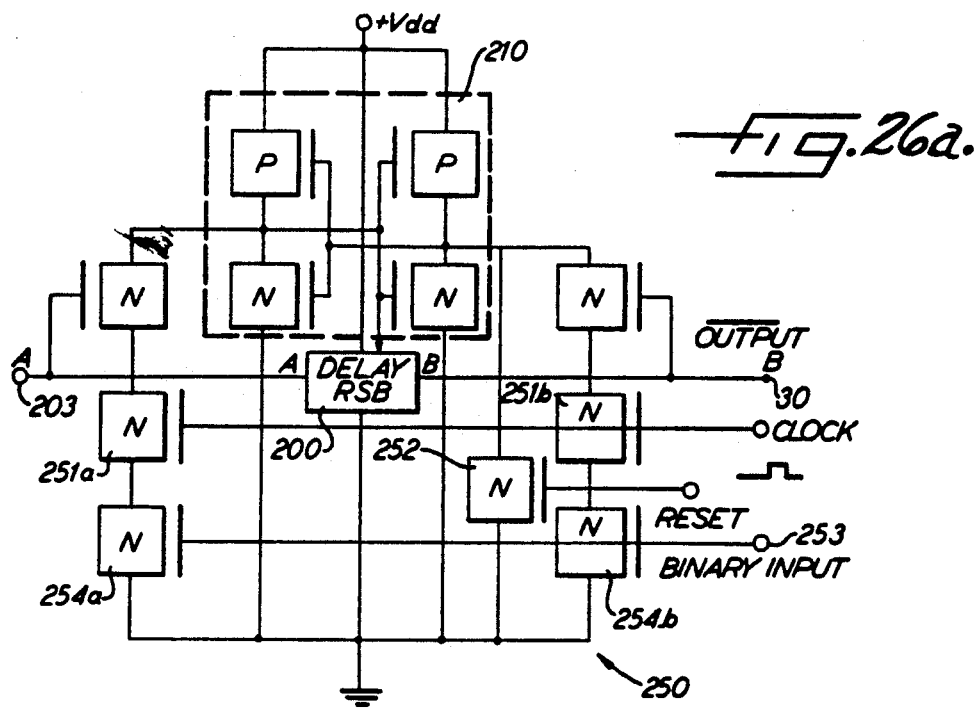
FIG. 26a illustrates a delay trigger stage according to the present invention.
Figure 26B:
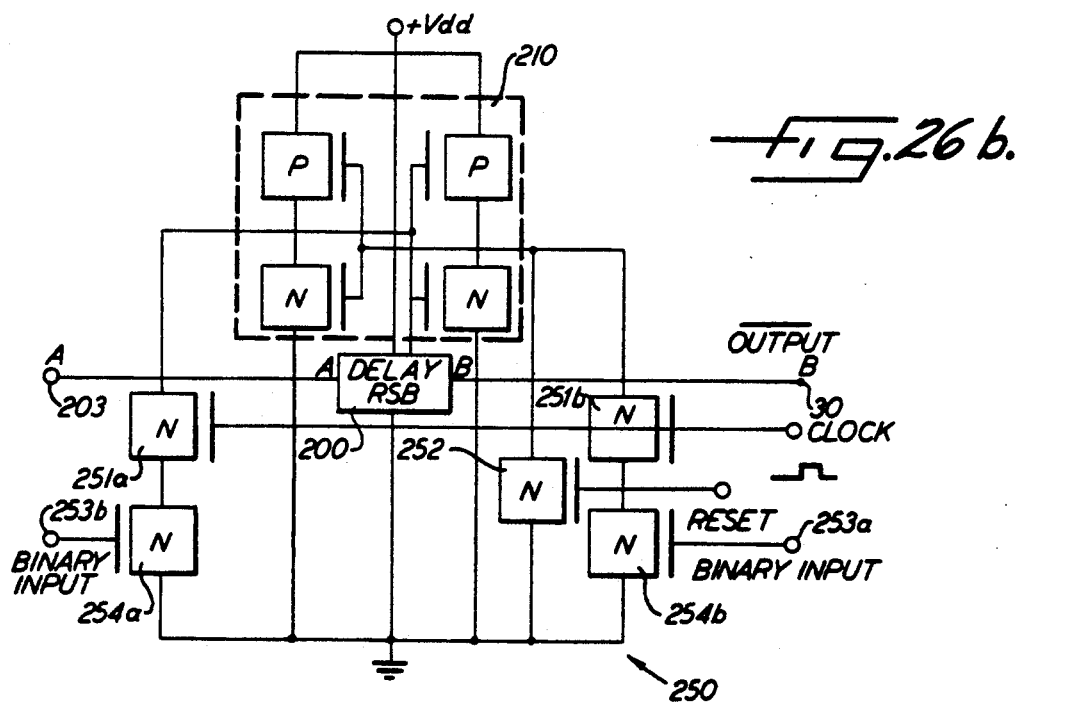
FIG. 26b illustrates a delay latch according to the present invention.

Referring now to FIG. 26a, a trigger stage 250 according to the invention is illustrated. Trigger stage 250 includes memory cell 210 coupled to Delay Ring Segment Buffer 200. Clocking is provided by N-channel transistors 251a and 251b, and a "reset" function is provided by transistor 252. The common binary input 253 is provided to cell 210 via transistors 254a and 254b. As is well known to those having skill in the art, the trigger stage can be modified to function as a binary shift register. The shift register is shown in FIG. 26b.

Figure 27:
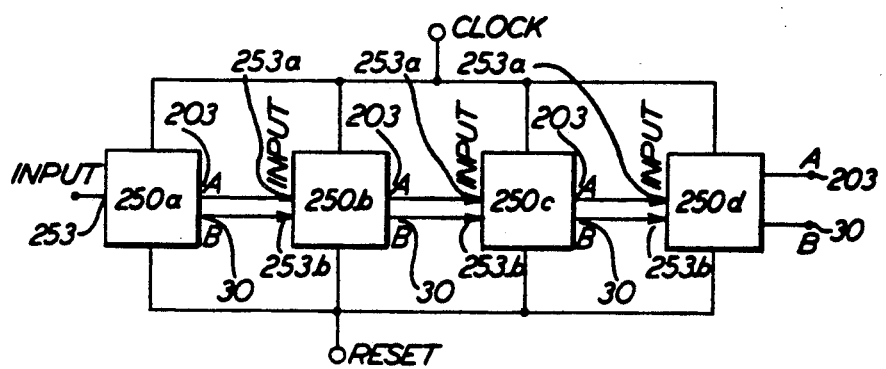
FIG. 27 illustrates a shift register according to the present invention.

FIG. 27 illustrates a four-stage shift register configured using shift register stages 250a-250d. As shown, the "A" and "B" outputs 203 and 204 of a preceding stage are connected to the "A" input 253a and "B" input 253b of a succeeding stage.

Figure 28:
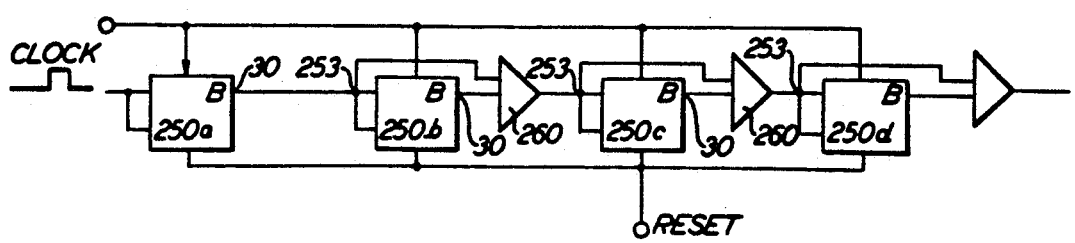
FIG. 28 illustrates a four stage binary counter according to the present invention.

FIG. 28 illustrates a four-stage binary counter. The counter couples the complementary "B" output 30 to the next stage's input 253 using CMOS AND gates 260 as necessary.

Figure 29:
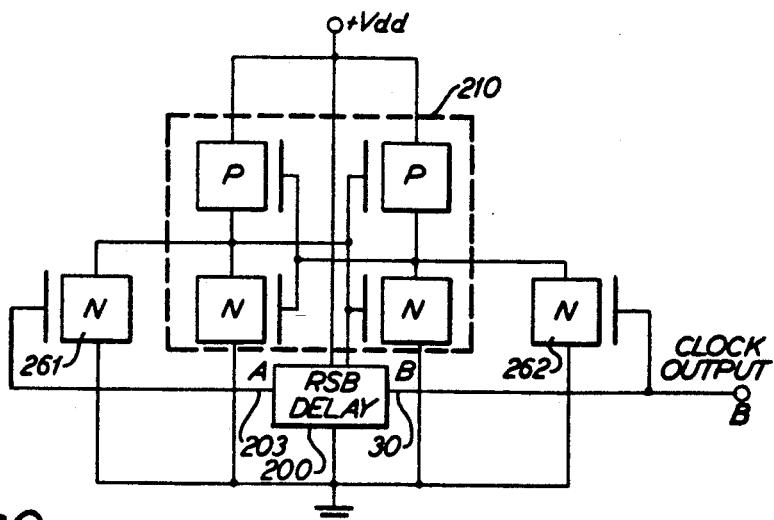
FIG. 29 illustrates a clock generator/multivibrator according to the present invention.

Referring now to FIG. 29, a clock generator or multivibrator according to the invention is shown. In the clock generator, the outputs 203 and 30 of Delay Ring Segment Buffer 200 are fed back to memory cell 210 via transistors 261 and 262 respectively. Both delay output signals are coupled to the input logic terminals that control the state of the RAM cell. This digital feedback causes the RAM cell to oscillate from one binary state to the other. The toggle rate of this clock generator is the inverse of twice the delay $T_d$ of the Ring Segment Buffer.

All high speed Delay Storage technology requirements can be satisfied by the Ring Segment Buffer configured as a delay device. Minimal external supporting logic is necessary.

Asynchronous Clock Pulse Generation

Figure 30:
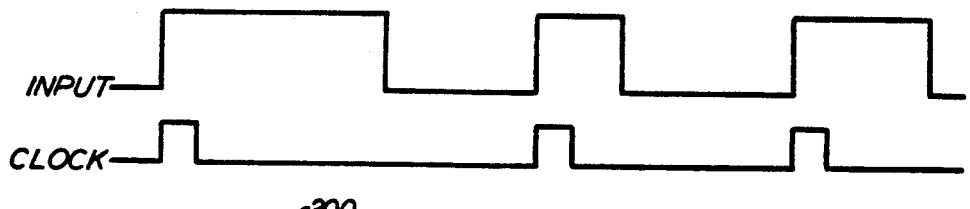
FIGS. 30-31 illustrate asynchronous clock pulse generators according to the present invention.
Figure 30:
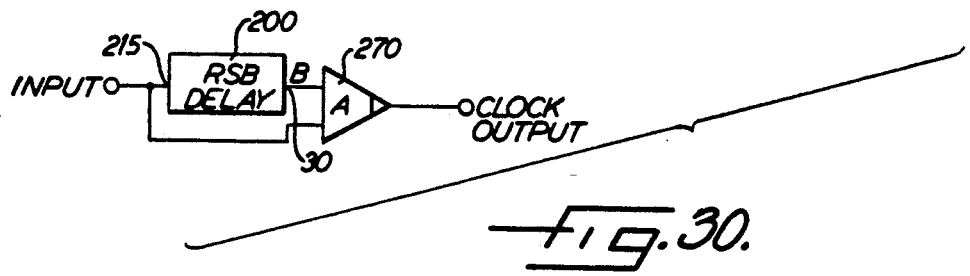
Figure 31:
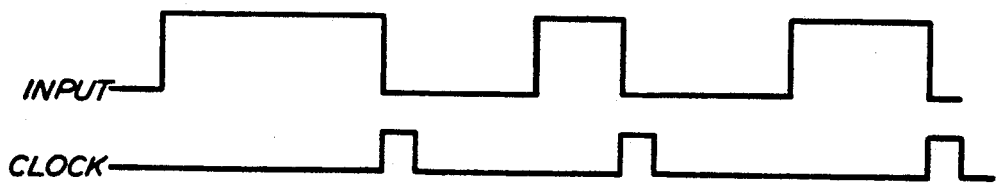
Figure 31:
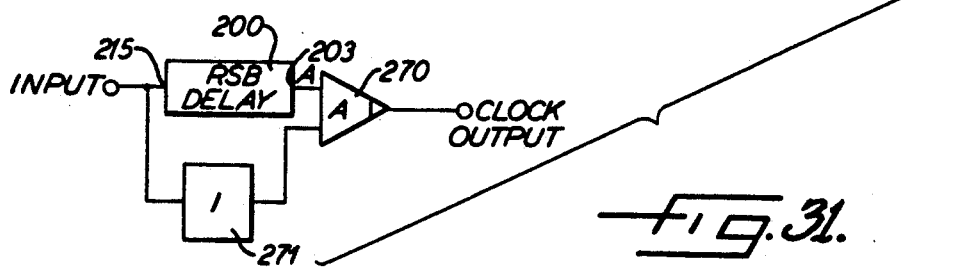

Referring now to FIGS. 30 and 31, the Delay Ring Segment Buffer 200 may also be used to construct an asynchronous clock pulse generator. FIG. 30 illustrates the control logic required to generate clock pulses at each rising edge of a stream of digital signal pulses. FIG. 31 illustrates the control logic required to generate clock pulses at each falling edge of a stream of digital signal pulses. The output logic gate 270 in FIGS. 29 and 30 is a "power AND" gate consisting of a two-input CMOS NAND gate buffered by a suitable Ring Segment Buffer to drive the anticipated load. Block I (271) is an inverter.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A transition signal pulse generator for generating a pulse of a predetermined duration upon occurrence of a predetermined input signal transition, comprising:
   a delay ring segment buffer having an input and an output, for producing said predetermined delay from said delay ring segment buffer input to said delay ring segment buffer output;
   a logic gate, having a first and a second input and an output, the output of said delay ring segment buffer being connected to the first input of said logic gate; and
   means for connecting an input signal to the input of said delay ring segment buffer and to said second input of said logic gate, to thereby generate a pulse of said predetermined duration at the output of said logic gate upon occurrence of a predetermined transition in the input signal.

2. The transition signal pulse generator of claim 1 wherein said logic gate comprises an AND gate and wherein said delay ring segment buffer comprises an inverting delay ring segment buffer, to thereby generate said pulse of said predetermined duration at the output of said AND gate upon occurrence of a positive transition in the input signal.

3. The transition signal pulse generator of claim 1 wherein said logic gate comprises and AND gate, and wherein said delay ring segment buffer comprises a noninverting delay ring segment buffer, and wherein said connecting means further comprises an inverter for connecting said input signal to said second input of said AND gate, to thereby generate said pulse of said predetermined duration at the output of said AND gate upon occurrence of a negative transition in the input signal.

4. The transition signal pulse generator of claim 2 wherein said inverting delay ring segment buffer comprises an odd number of serially connected complementary field effect transistor inverter stages.

5. The transition signal pulse generator of claim 3 wherein said inverting delay ring segment buffer comprises an even number of serially connected complementary field effect transistor inverter stages.

6. The transition signal pulse generator of claim 1 further comprising a ring segment buffer, the input of which is connected to the output of said logic gate.

7. The transition signal pulse generator of claim 1 wherein said logic gate comprises an AND gate.

8. The transition signal pulse generator of claim 1 wherein said logic gate comprises a NAND gate.

9. The transition signal pulse generator of claim 1 wherein said delay ring segment buffer comprises:
   a plurality of serially connected complementary field effect transistor inverter stages, each of said complementary field effect transistor inverter stages comprising a serially connected N-channel field effect transistor and P-channel field effect transistor, the N-channel and P-channel field effect transistors having predetermined channel widths and channel lengths, each of said complementary field effect transistor inverter stages having an input and an output, with the output of an immediately preceding inverter stage being connected to the input of an immediately succeeding inverter stage, and the output of the last inverter stage being connected to the first input of the logic gate;
   the N-channel field effect transistor in each inverter stage having a channel width which is less than a predetermined factor times the width of the N-channel of the immediately preceding inverter stage; and
   the channel lengths of the field effect transistors in the inverter stages being at least a first predetermined length, to thereby produce said predetermined delay from the input of the first inverter stage to the output of the last inverter stage.

* * * * *